(12) United States Patent
Ido et al.

(10) Patent No.: US 7,623,055 B2
(45) Date of Patent: Nov. 24, 2009

(54) WEIGHT LEVEL GENERATING METHOD AND DEVICE UTILIZING PLURAL WEIGHTS AT DIFFERENT TIME RATES

(75) Inventors: Toru Ido, Minoo (JP); Soichiro Ishizuka, Ebina (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/697,228

(22) Filed: Apr. 5, 2007

(65) Prior Publication Data

US 2007/0279271 A1    Dec. 6, 2007

(30) Foreign Application Priority Data

Apr. 6, 2006  (JP)  ............... 2006-104857
Apr. 6, 2006  (JP)  ............... 2006-104858

(51) Int. Cl.
*H03M 1/80* (2006.01)
(52) U.S. Cl. ...................... 341/153; 341/144

(58) Field of Classification Search .......... 341/140–154
See application file for complete search history.

(56) References Cited

U.S. PATENT DOCUMENTS

| 5,513,209 | A  | * | 4/1996  | Holm ...................... 341/61 |
| 5,757,791 | A  | * | 5/1998  | Kanterakis et al. ........ 370/342 |
| 6,289,062 | B1 | * | 9/2001  | Wang et al. ............... 375/346 |
| 6,466,149 | B2 | * | 10/2002 | Tabler ....................... 341/144 |
| 6,469,648 | B2 | * | 10/2002 | Nakao et al. .............. 341/153 |
| 6,509,857 | B1 | * | 1/2003  | Nakao ....................... 341/153 |
| 7,034,733 | B2 | * | 4/2006  | Dedic et al. ............... 341/144 |

* cited by examiner

*Primary Examiner*—Lam T Mai
(74) *Attorney, Agent, or Firm*—William B. Kempler; Wade J. Brady, III; Frederick J. Telecky, Jr.

(57) ABSTRACT

A weight level generator is provided. Weight level generator W has plural weight generators $5\text{-}1\text{-}5\text{-}j$. At least one of said plural weight generators is used at at least two different time rates. Also, a digital-to-analog converter (DAC) using said weight generators is equipped with a digital signal source, a weight controller, and a weight generator.

24 Claims, 16 Drawing Sheets

WEIGHT LEVEL GENERATOR W

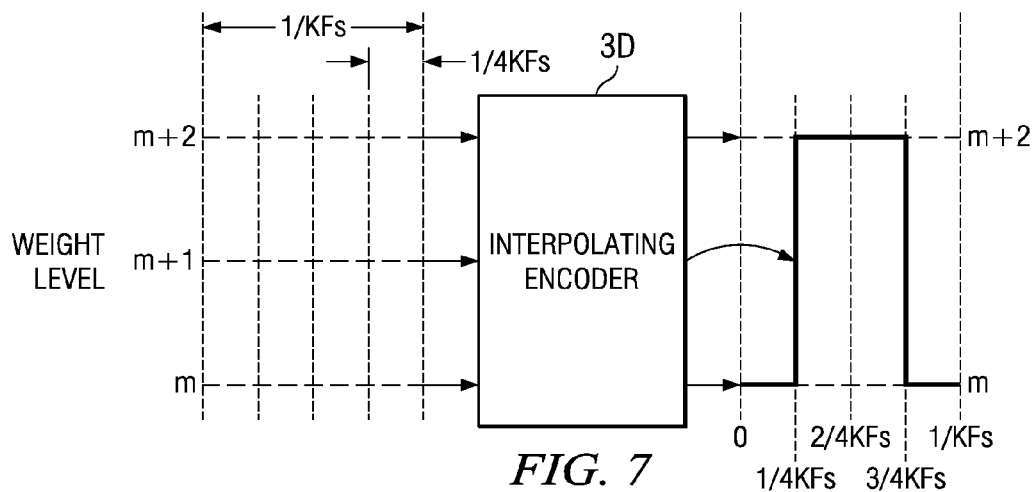
*FIG. 7*
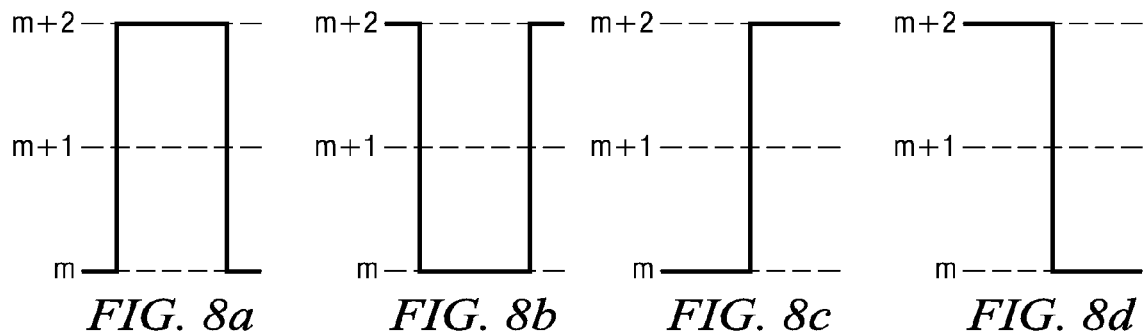
*FIG. 8a*  *FIG. 8b*  *FIG. 8c*  *FIG. 8d*
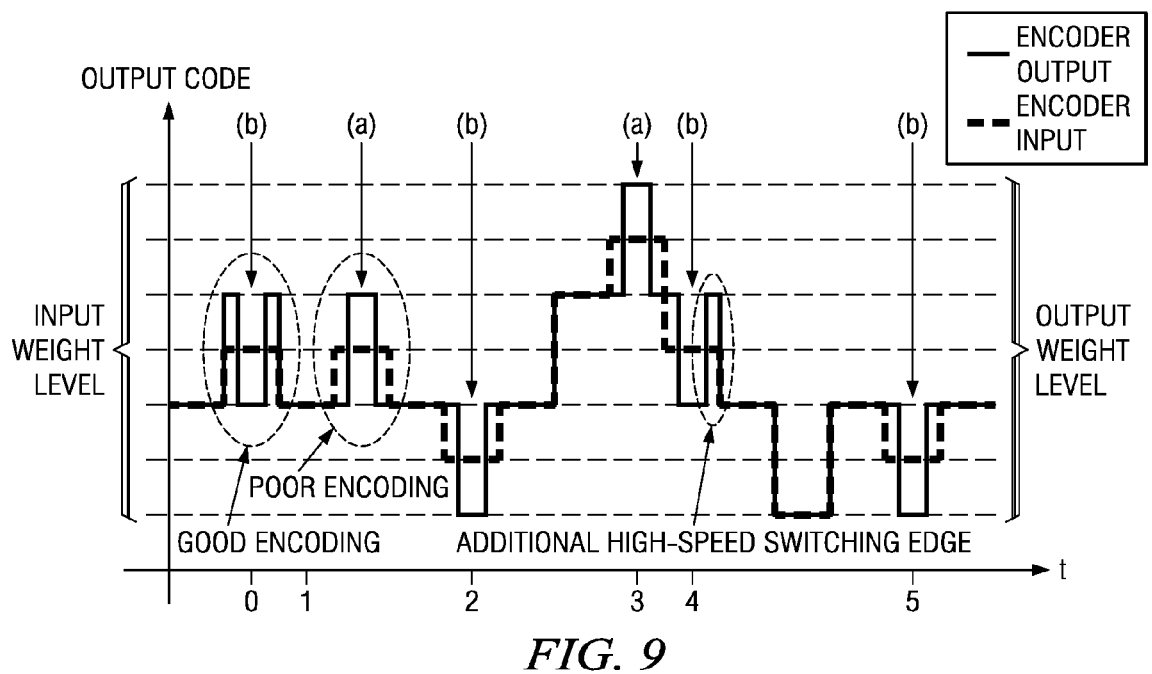
*FIG. 9*

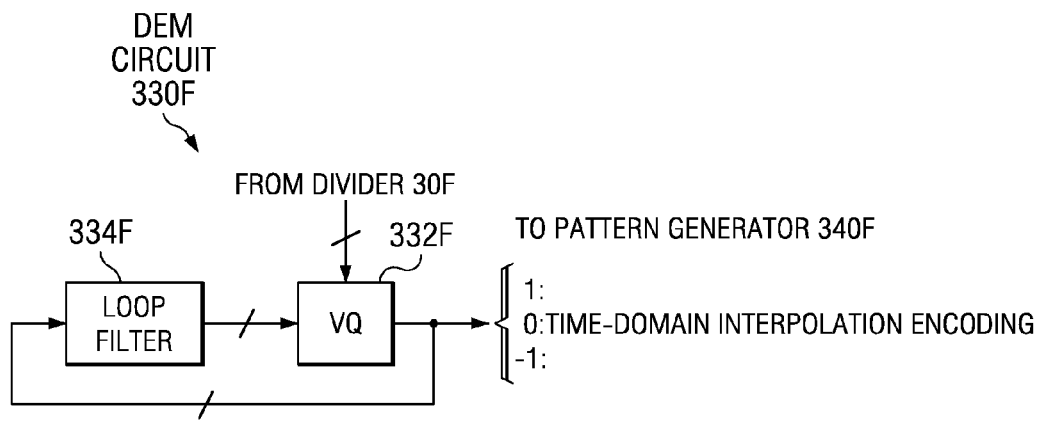
*FIG. 12*
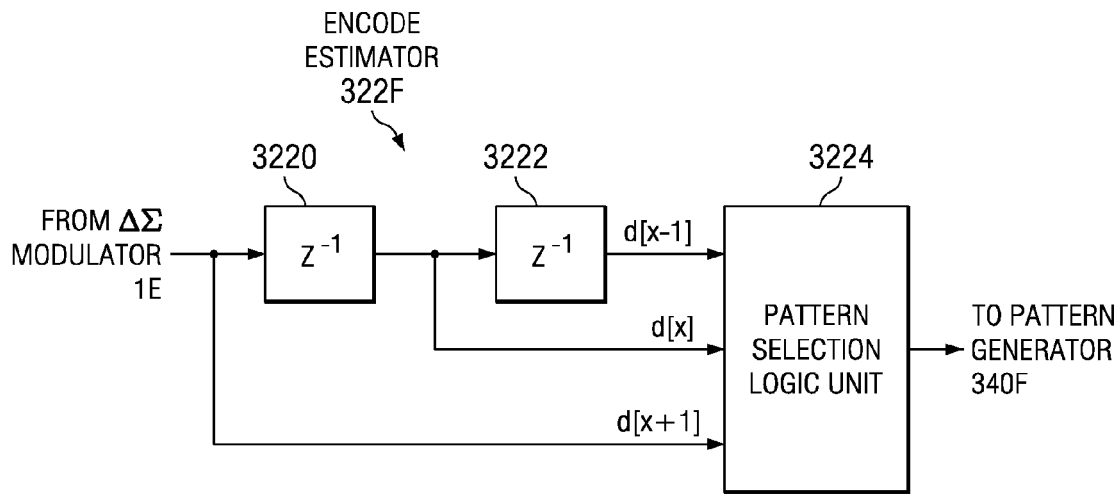
*FIG. 14*
| | CONDITION | SLECTING PATTERN |
|---|---|---|
| 1 | d[x-1]=d[x]-1 AND d[x+1]=d[x]-1 | PROJECT UPWARD |
| 2 | d[x-1]=d[x]+1 AND d[x+1]=d[x]+1 | PROJECT DOWNWARD |
| 3 | DOES NOT FIT CASE 1 OR 2, d[x]≥0 | PROJECT UPWARD |
| 4 | DOES NOT FIT CASE 1 OR 2, d[x]<0 | PROJECT DOWNWARD |
*FIG. 15*

WEIGHT LEVEL GENERATING METHOD AND DEVICE UTILIZING PLURAL WEIGHTS AT DIFFERENT TIME RATES

This application claims priority from Japanese Patent Application Nos. 2006-104857 and 2006-104858, both filed Apr. 6, 2006, the entireties of which are incorporated herein by reference. Pending U.S. patent application Ser. No. 11/697,235, filed on the same date as this application and which claims priority from the same Japanese applications is also incorporated herein by reference.

BACKGROUND OF THE INVENTION

The present invention relates to weight level generation; and, in particular, to a method and device for generating weight levels that can be used for converting digital signals into analog signals.

In a conventional digital-to-analog converter (DAC), the quantization number for a digital signal must be consistent with the number of weight levels used when generating the analog signal, and the number of weight generators used for generating the analog signal must correspond to the number of weight levels. In particular, in the case of a configuration in which plural weight generators have equal weights in order to receive a thermometer code, it is desired that the number of said weight generators be consistent with the number of weight levels.

In the case of a typical DAC equipped with a conventional delta sigma ($\Delta\Sigma$) modulator (that is, $\Delta\Sigma$ modulation DAC), the out-of-band noise is the remainder after noise shaping is performed by the $\Delta\Sigma$ modulator. The source of the out-of-band noise is the quantization noise. Since the amount of quantization noise is a function of the number of quantization levels, one method for reducing the amount of quantization noise is to increase the number of quantization levels. In this method, in order to increase the number of quantization levels, the number of weight generators (known as "analog segments") in the DAC must be increased. The increase in the number of analog segments will inevitably increase the area on the IC chip occupied by such analog segments. Consequently, the method of reducing the out-of-band noise by increasing the number of quantization levels is limited from the standpoint of realizing a DAC with limited IC chip area.

On the other hand, another method of reducing the quantization noise is to increase the operating speed of the $\Delta\Sigma$ modulator (that is, the over-sampling frequency is increased). In this method, however, the analog performance of the DAC deteriorates. In other words, as the over-sampling frequency is increased, the switching rate for the analog segments also increases. As a result, the distortion in the analog segment output increases, leading to deterioration of the distortion performance. Consequently, the method of reducing the out-of-band noise by increasing the operating speed of the $\Delta\Sigma$ modulator is also limited from the standpoint of realizing a certain distortion performance for the DAC.

SUMMARY OF THE INVENTION

In one aspect, the present invention provides a weight level generating method and device that addresses the aforementioned problem. In another aspect, the present invention provides a digital-to-analog conversion method and device that uses such weight level generating method or weight level generator.

According to an embodiment of the present invention, the weight level generating method has plural weights and uses at least one of such plural weights at at least two different time rates. According to another embodiment of the present invention, a digital-to-analog conversion method uses such weight level generating method. According to yet another embodiment of the present invention, a weight level generator is equipped with plural weight generators and uses at least one of such plural weight generators at at least two different time rates. According to yet another embodiment, a digital-to-analog converter uses such weight level generator.

BRIEF DESCRIPTION OF THE DRAWINGS

Example embodiments of the invention are described with reference to accompanying drawings, wherein:

FIG. 7 is a diagram illustrating the input and output waveforms of the interpolating encoder for explaining the interpolation operation performed by the interpolating encoder shown in FIG. 6.

FIGS. 8a-8d are diagrams illustrating the waveforms of four weight use pattern candidates that can be used in the time-domain interpolation encoding method in the DAC shown in FIG. 6.

FIG. 9 is a diagram of a waveform example, illustrating the relationship between the input and output of the interpolating encoder when the time-domain interpolation encoding method is used for the DAC shown in FIG. 6.

FIG. 12 is a block diagram illustrating the entire dynamic element matching (DEM) circuit shown in FIG. 11.

FIG. 14 is a block diagram illustrating a configuration for the encode estimator 322F of FIG. 11.

FIG. 15 is a encode/pattern selecting table illustrating the selection algorithm in pattern selection logic unit 3224 of FIG. 14.

DESCRIPTION OF THE EMBODIMENTS

According to one embodiment of the present invention, if at least one weight generator is used at at least two time rates, the number of weight levels that can be realized by a given number of analog segments can be increased without increasing the number of the weight generators, that is, analog segments. In other words, the number of weight generators required to realize a certain number of weight levels can be reduced.

According to another embodiment of the present invention, if the number of segments used at high time rate out of all of the analog segments is limited, the rest of the segments can be used at a low time rate. In this way, the distortion that increases as a result of increasing the switching rate by the segment used at the high time rate is limited in the case when the weight level generator or DAC is viewed as a single unit. As a result, the quantization noise can be reduced while maintaining the expected distortion performance for the single unit of the weight level generator or DAC.

In the following, the various embodiments of the present invention will be explained in detail with reference to figures.

Figure 1:
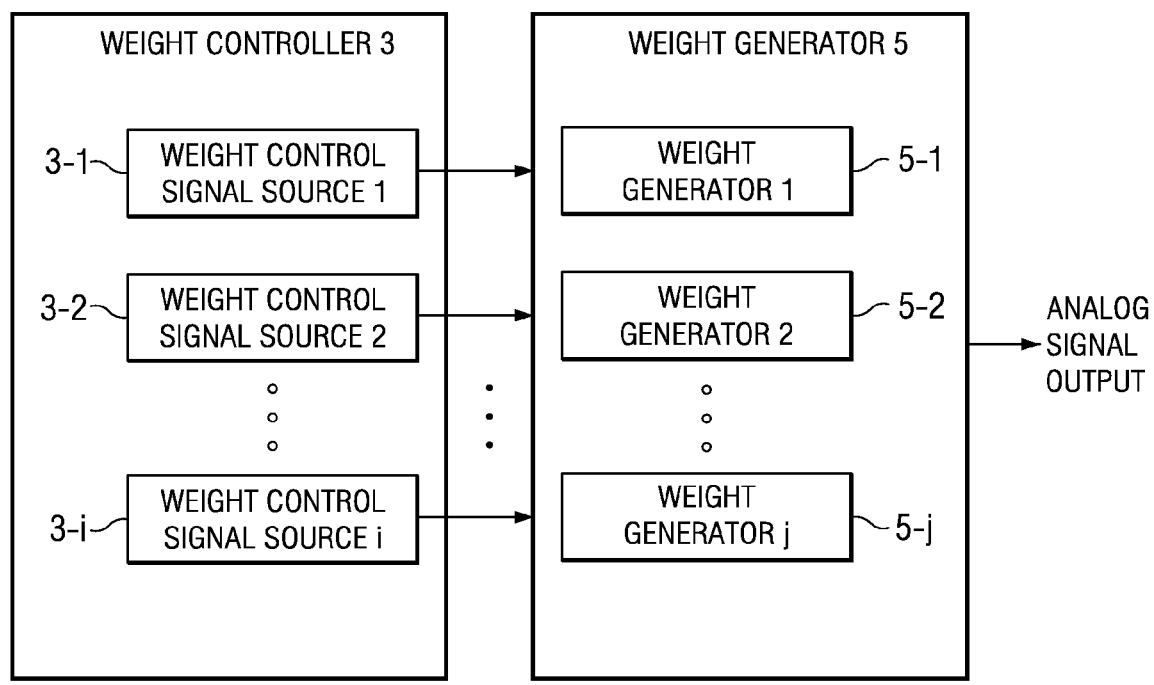
FIG. 1 is a block diagram illustrating the weight level generator disclosed in an embodiment of the present invention.

FIG. 1 shows a weight level generator W disclosed in one embodiment of the present invention. Said weight level generator W is equipped with weight controller 3 and weight generator 5. Weight controller 3 is a multi-time rate controller having i weight control signal sources 3-1-3-i. Said weight control signal sources 3-1-3-i generate weight control signals at different time rates: first time rate TR1, second time rate TR2 . . . ith time rate TRi. The time rates can be determined by the frequency. The relationship between the time rates is TR1<TR2< . . . <TRi. Each time rate can be an integral multiple, such as 4 times or 8 times, of the previous time rate. Weight generator 5 that receives the weight control signals of different time rates has j weight generators 5-1-5-j. These weight generators are comprised of an inverter, switched capacitor, current source, etc. The weight generated by these weight generators can be in the form of current or voltage, etc. The outputs of these weight generators can be combined by being summed to output an analog signal. At least one of said weight generators receives weight control signals not only for time rate TR1 but also for a different time rate TR2 or another time rate, while other weight generators only receive the lowest time rate TR1. By adopting this configuration, when the weights generated by the weight generators are equal to each other, compared with the weight levels that can be generated by the weight generators that only receive time rate TR1, the weight generator that receives not only time rate TR1 but also time rate TR2, for example, can generate additional weight levels besides the original number of weight levels. The additional weight level constitutes an interpolation weight level that interpolates the weight level of the weight generators that only receive time rate TR1. When at least one of the weight generators that generates equal weights is used at at least two different time rates, as described above, a greater number of weight levels can be generated than by j weight generators. For example, if the number of weight levels that can be generated by j weight generators is j, if only one of the j weight generators is used at time rate TR1 and a time rate of four times faster while the rest of the weight generators are used at time rate TR1, 2j weight levels, for example, can be generated. The number of weight levels is not limited to 2j. It can also be 4j or some other number.

Figure 1A:
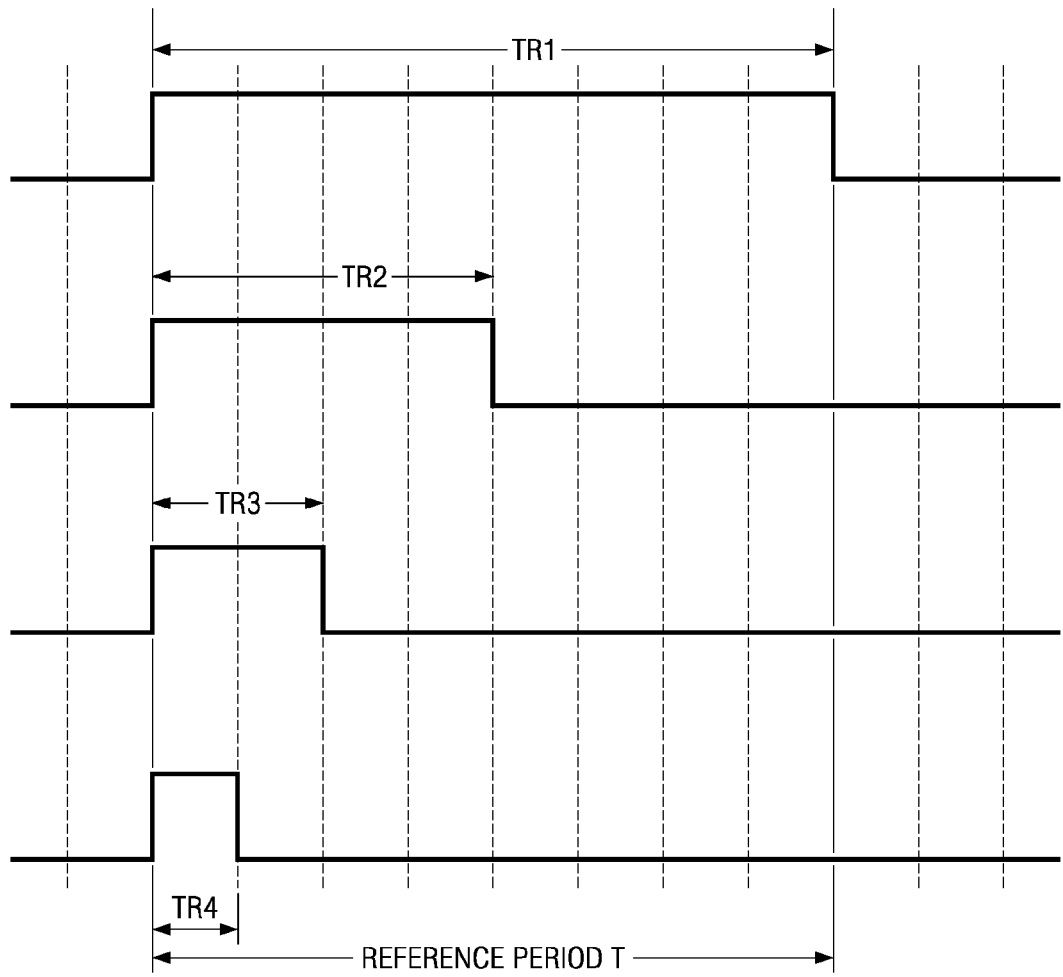
FIG. 1a is a waveform diagram illustrating an example of the weight control signal for multiple time rates.

In the following, an example of said multi-time rate will be explained based on FIG. 1a. In this example, the weight controls signals for four different time rates TR1-TR4 are shown. For the purpose of simplification, only a waveform with positive logic and a duty ratio of 1 that rises from the beginning time point of the reference period T is shown. However, the waveform can also be negative logic and rise from a time point later than the starting time point of the reference period T. As shown in the figure, when plural time rates TR1-TR4 have the reference period T shown in the figure, time rate TR1 has the same period as reference period T. TR2 has a period ½ of the reference period T. That is, it is a time rate twice of TR1. TR3 has a period ¼ of the reference period. That is, it is a time rate four times of TR1. TR4 has a period ⅛ of the reference period T. That is, it is a time rate 8 times of TR1. If the weight level that can be realized by the weight control signal of TR1 is 1, weight level ½ can be realized by the weight control signal of TR2. Additional weight levels ¼, ²⁄₄, ¾ can be realized by the weight control signal of TR3. Additional weight levels of ⅛, ²⁄₈, ⅜, ⁴⁄₈, ⅝, ⁶⁄₈, ⅞ can be realized by the weight control signal of TR4.

The weight level generator W shown in FIG. 1 is not only a DAC that generates an analog signal from a digital signal. It can also be used in any other device that uses weight levels. The original signal to be converted is not limited to ordinary binary signals. It can have various forms as long as a binary signal is obtained after ΔΣ modulation. Said weight level generator W can also be used to change the number of quantization levels or the number of weight levels for the digital signal, that is, to change the number of bits in the binary signal.

In the following, the digital-to-analog converter (DAC) B disclosed in an embodiment using the weight level generator W shown in FIG. 1 to digital-to-analog conversion will be explained based on FIG. 2. In this figure, symbol "B" is appended to the same reference number for elements corresponding to FIG. 1. As shown in the figure, DAC B is equipped with digital signal source 1 and weight level generator WB. Weight level generator WB is equipped with weight controller 3B and weight generator 5B. Digital signal source 1 outputs the supplied digital signal directly or outputs the result of any signal processing performed to the supplied digital signal. The digital signal output from said digital signal source 1 is supplied to weight controller 3B. Then, weight controller 3B generates a controller output including a group of multi-time rate weight control signals explained in FIG. 1 from the received digital signal. The controller output is supplied to weight generator part 5B. Each weight generator in one group of weight generators included in weight generator part 5B generates a weight output in response to the corresponding weight control signal in one group of weight control signals included in the controller output. The weight outputs generated from one group of weight generators are combined by being summed, etc. to generate an analog signal.

Figure 2:
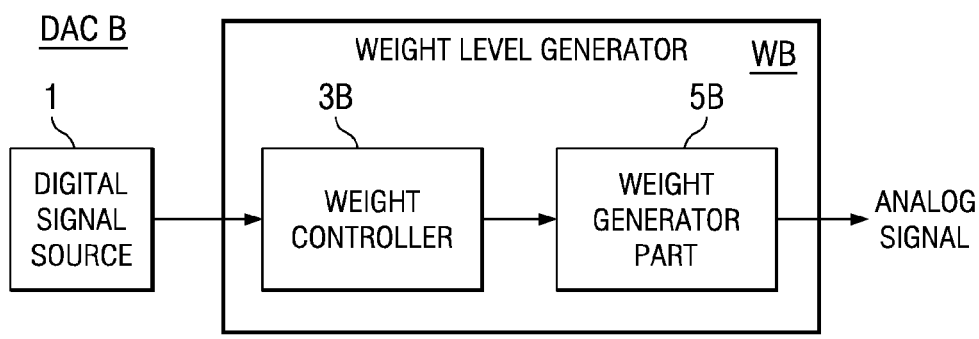
FIG. 2 is a diagram illustrating a digital-to-analog converter (DAC) disclosed in an embodiment using the weight level generator shown in FIG. 1 in digital-to-analog conversion.

In the DAC B shown in FIG. 2, since multi-time rate weight control signals are generated instead of single-time rate signals, more weight levels can be realized. Consequently, a DAC with a given resolution can be made up of fewer weight generators.

Figure 3:
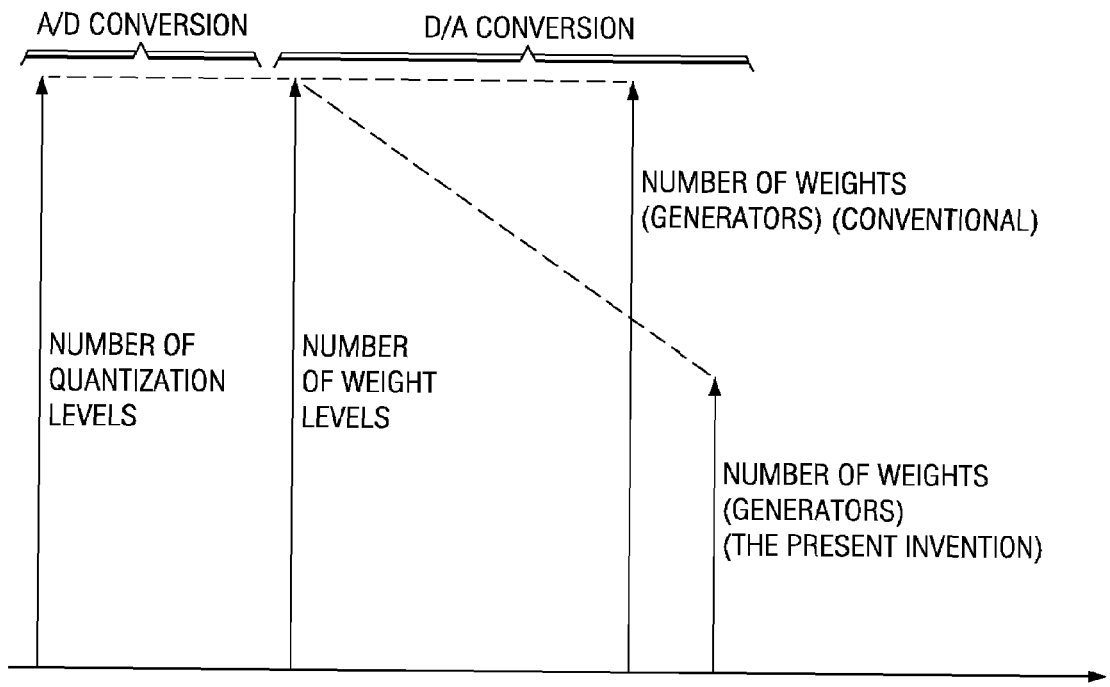
FIG. 3 is a diagram illustrating the relationship between the number of quantization levels during A/D conversion, the number of weight levels during D/A conversion, and the number of weights (or weight generators) in the conventional technology and the present invention in the DAC shown in FIG. 2.

FIG. 3 shows the fact that the number of weights or weight generators can be reduced. As shown in the figure, when a certain number of quantization levels are used for a certain A/D conversion, the number of weight generators is equal to the number of quantization levels in the conventional technology. In the present invention, however, the number of weight generators is reduced by using a multi-time rate. FIG. 3 shows its relationship.

Figure 4:
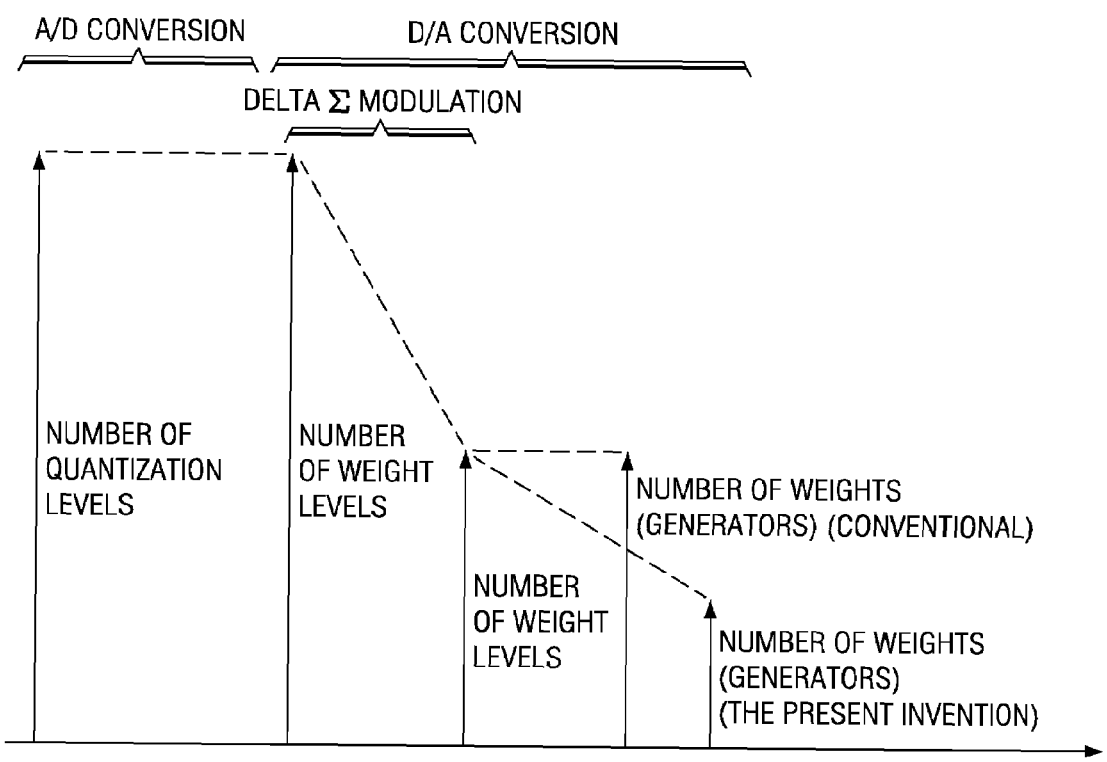
FIG. 4 is the same diagram as FIG. 3 in the case when $\Delta\Sigma$ modulation is added to D/A conversion.

Also, FIG. 4 shows the same diagram as FIG. 3 for the case when $\Delta\Sigma$ modulation is used in D/A conversion. As shown in the figure, when $\Delta\Sigma$ modulation is used, the number of weight levels required for D/A conversion is reduced. When the present invention is used, the reduced number of weight levels can be further reduced.

Figure 5:
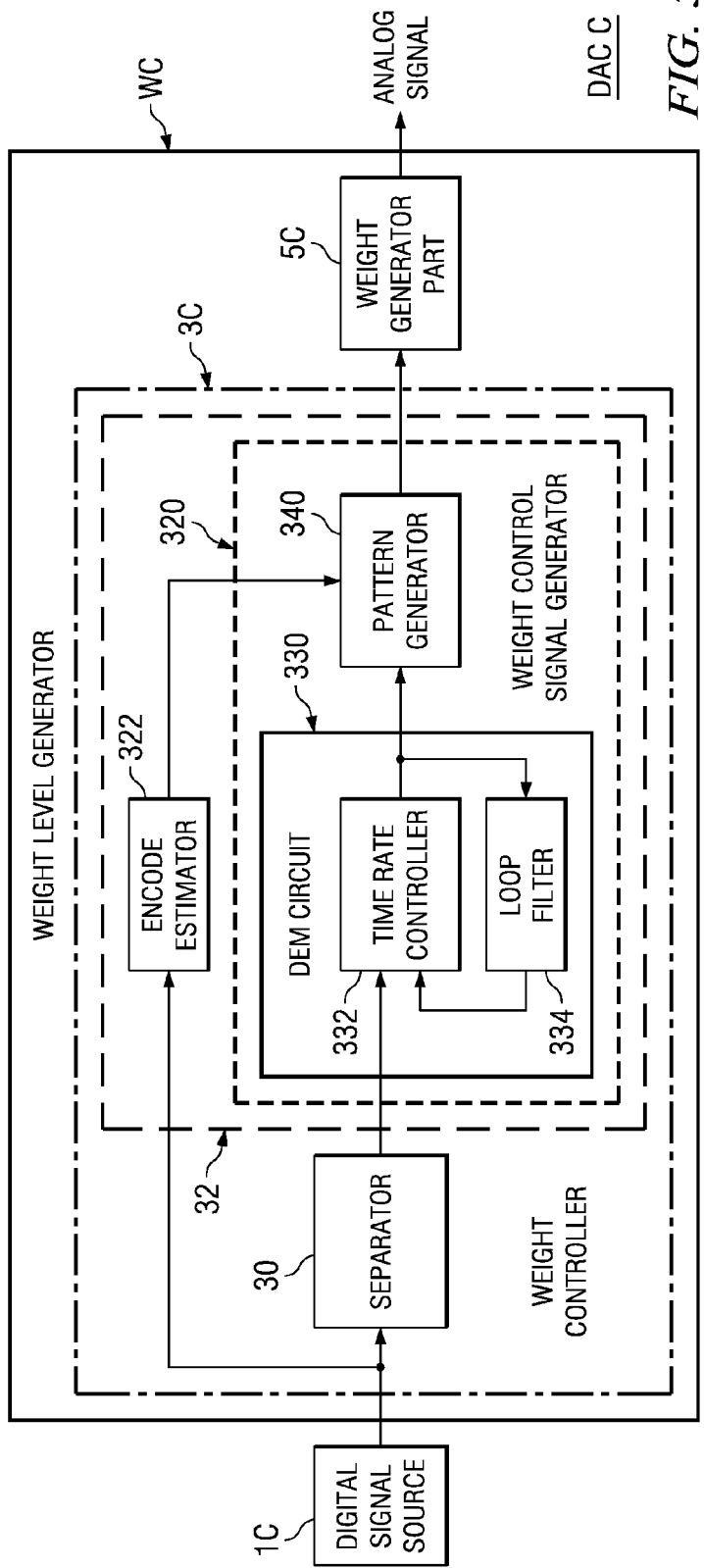
FIG. 5 is a block diagram illustrating the digital-to-analog converter (DAC) in an embodiment that further embodies the DAC shown in FIG. 2.

In the following, the digital-to-analog converter (DAC) of an embodiment that further embodies the DAC B shown in FIG. 2 will be explained based on FIG. 5. This DAC C is equipped with a dynamic element matching (DEM) circuit. In FIG. 5, symbol "C" is appended to the same reference number for the elements corresponding to FIG. 1. As shown in the figure, said DAC C is equipped with digital signal source 1 and weight level generator WC in the same way as shown in FIG. 2. In the DAC C shown in FIG. 5, weight controller 3C is equipped with separator 30 and weight control signal generator 32. Weight control signal generator 32 is equipped with encoder 320 and encode estimator 322. Encoder 320 is equipped with DEM circuit 330 and pattern generator 340. DEM circuit 330 is equipped with time rate controller 332 and loop filter 334. Loop filter 334 is arranged in the feedback path from the output to the input of time rate controller 332 and performs dynamic element matching processing. Said DEM processing is a method for reducing mismatches between the weights generated by the plural weight generators set in weight generator part 5C.

More specifically, separator 30, which receives digital signals from digital signal source 1C, separates the digital signal into plural digital signal parts suitable for different time rates or group of time rates. For example, if the digital signal is separated into two digital signal parts, the digital signal is separated into a first digital signal part suitable for the first time rate (for example, TR1) and a second digital signal part suitable for the first time rate and the second time rate (for example, TR2) higher than the first time rate. Said DEM circuit 330 to which the separated digital signal parts are supplied applies the corresponding time rate to each digital signal part to generate encode signal by controlling the time rate with respect to each separated digital signal part. In other words, each encode signal includes a signal of the time rate to be applied to the signal part with respect to the corresponding digital signal part. For example, in the aforementioned example, the first encode signal generated from the first digital signal part includes the signal of the first time rate in the first digital signal part. The second encode signal generated from the second digital signal part includes the signal of the first or second time rate in the second digital signal part. Any form of signal can be used for identifying the time rate. However, when only two time rates, that is, the first time rate and the second time rate are used, it is possible to use an identification signal that indicates only one of the time rates.

The encode signals generated as described above are sent to pattern generator 340. Then, said pattern generator 340 generates a weight control signal supplied to the corresponding weight generator (in weight generator part 5) to be driven by said encode signal from each received encode signal. More specifically, said pattern generator 340 also receives the output from encode estimator 322 besides the output from DEM circuit 330. Encode estimator 322 receives the digital signal supplied from digital signal source 1C and controls the pattern of the weight control signals generated by pattern generator 340 based on the history of the received digital signal. More specifically, pattern generator 340 prepares a plurality of use patterns for the possible cases as the patterns for using weight generators. In this case, the plurality of use patterns are equivalent to each other from the standpoint of the weight levels that can be used but are different as the patterns for use/not use of the weight generators. In order to determine which equivalent use pattern should be used, encode estimator 322 estimates the optimal use pattern based on the history information of the relationship between at least two adjacent samples of the digital signal. By using the optimal use pattern, better distortion performance can be obtained for the weight generators. Each of the plural weight control signals generated by pattern generator 340 is supplied to the corresponding weight generator in weight generator part 5C in the same way as shown in FIG. 2. Then, the weights generated by the weight generators are combined to generate an analog signal.

Figure 6:
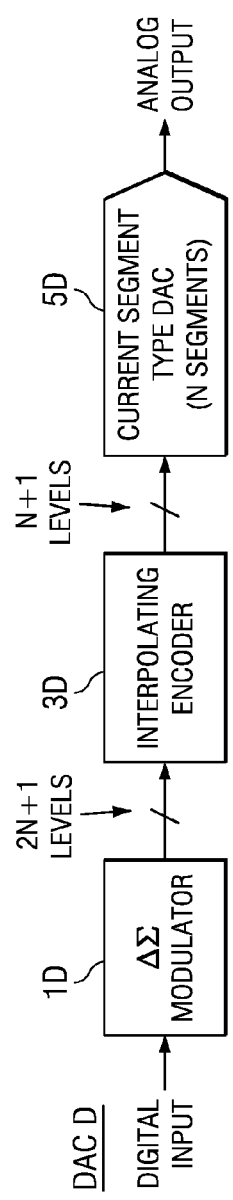
FIG. 6 is a block diagram illustrating the digital-to-analog converter (DAC) in an embodiment that further embodies the DAC shown in FIG. 2.

In the following, DAC D in an embodiment that further embodies the DAC B shown in FIG. 2 will be explained based on FIG. 6. Said DAC D uses $\Delta\Sigma$ modulation. In this figure, symbol "D" is appended to the same reference number for the elements corresponding to FIG. 1. More specifically, DAC D is equipped with $\Delta\Sigma$ modulator 1D, interpolation encoder 3D, and current segment type DAC 5D. The digital input to be converted into an analog form is supplied to modulator 1D. Then, the modulator performs $\Delta\Sigma$ modulation in order to reduce the noise with respect to the received digital input. The modulation output is generated as a digital output. Interpolating encoder 3D receiving the digital output from the modulator is an element equivalent to weight controller 3B shown in FIG. 2. However, it can also be called as time rate interpolating encoder since it can generate an interpolating weight level depending on the processing in the "time-domain." Said interpolating encoder 3D generates the same encoder output as the output of weight controller 3B shown in FIG. 2. Current segment type DAC 5D receiving the encoder output has N current segments that can generate the same current as analog segments that function as weight generators.

In the DAC D with the aforementioned configuration, if the sampling frequency of the digital input is Fs, for example, modulator 1D operates at an over-sampling frequency (KFs) of K times. Also, interpolating encoder 3D operates at a frequency four times said frequency for the purpose of time-domain interpolation, that is, 4 KFs. DAC 5D also operates at frequency 4 KFs. In this case, a clock frequency that is four times higher than that of the conventional DAC is required. Such a clock signal can be obtained from the system clock or by using another PLL circuit. For example, in an existing DAC, since 256 Fs is supported, modulator 1D can operate at 64 Fs (¼ of 256 Fs), for example. When receiving a digital input with a certain number of bits, modulator 1D converts it into a modulation digital output that can be represented by (2N+1) weight levels. Then, interpolating encoder 3D converts the modulation digital output into a digital output that can be represented by (N+1) weight levels. Said (N+1) weight levels can be converted into analog output by a DAC having N segments. Also, in this example, the operating speed of interpolating encoder 3D is four times that of modulator 1D. It can also be used at a rate of other magnifications.

In the following, the interpolating operation of interpolating encoder 3D shown in FIG. 6 will be explained based on FIG. 7. As shown in FIG. 7, the left side of interpolating encoder 3D is its input (output of modulator 1D), while its right side is its output. The input of the interpolating encoder has a period of 1/KFs as shown in the figure. Also, three adjacent weight levels, that is, m, m+1, m+2 out of said 2N+1 weight levels are shown in this figure. Interpolating encoder 3D allows even-numbered weight levels to pass without processing and only interpolates the odd-numbered weight level. In other words, when receiving the input of even-numbered weight level m or m+2, interpolating encoder 3D outputs it directly using the same time rate as the input (that is, KFs). However, when receiving an odd-numbered weight level m+1, interpolating encoder 3D generates a weight control signal using the adjacent even-numbered weight level at a time rate four times the input. For example, this weight control signal can have a pattern that uses weight level m in the first and fourth periods out of four ¼ KFs periods and uses weight level m+2 in the second and third periods. This pattern has a duty ratio of ½ when viewed in the time rate of the input. The average value of the weight levels of this pattern is m+1. In this way, the interpolating weight level can be formed. As described above, the number of weight levels (2N+1) present in the output of modulator 1D can almost be halved to (N+1). Also, in this way, the out-of-band noise energy of the DAC can almost be halved.

FIGS. 8a-8d show candidates for the use pattern of four weights that can be adopted in the aforementioned time-domain interpolation encoding method. FIG. 8a shows the pattern shown in FIG. 7. FIG. 8b is the inverse of pattern FIGS. 8a. FIGS. 8c and d are patterns that use weight level m or m+2 in the first two periods out of four ¼ KFs periods and use the other weight level in the second two periods. When all of these patterns have a time rate of 4 KFs, the duty ratio is 1 and 0. However, when they have the time rate (KFs) of the input, the duty ratio becomes ½.

FIG. 9 is a waveform example illustrating the relationship between the input and output of interpolating encoder 3 in the case when the time-domain interpolation encoding method is applied. The waveform of the input is indicated by the dotted line, while the waveform of the output is indicated by the solid line. Whether the pattern shown in FIG. 8a or FIG. 8b is used is explained with reference to this waveform example. Also, the weight level used to express the input to the interpolating encoder is shown on the left side in the figure, while the weight level used to express the output of the interpolating encoder is shown on the right side. In the time-domain interpolation encoding method disclosed in the present invention, a high-speed switching edge for the current segments in DAC 5D is generated. Said high-speed switching edge, however, will cause deterioration of the distortion performance of the DAC. The optimal pattern out of the patterns (a) and (b) shown in FIGS. 8a and 8b can be used in order to minimize the deterioration of the distortion performance. FIG. 9 shows pattern selection for samples 0-5. More specifically, for samples 0 and 1, the input weight level is the same, but pattern (b) is used for sample 0, while pattern (a) is used for sample 1. Clearly, sample 0 has more switching edges than sample 1. Consequently, sample 1 is well encoded. It is preferred to use pattern (a) also for sample 0. Said pattern selection is dependent on the values of the samples before and after the targeted sample. For example, pattern (a) is suitable for sample 1 because both of the samples before and after sample 1 have smaller values than sample 1. The situation is the same for sample 3. On the other hand, for sample 2, pattern (b) is suitable because both the samples before and after sample 2 have larger values. The situation is the same for sample 5. For sample 4, however, one of the samples before and after it is larger than sample 4, while the other one is smaller than sample 4. In this case, if pattern (b) is used, the additional high-speed switching edge enclosed by the dotted line is generated. Said additional high-speed switching edge cannot be avoided since it occurs in the same way when pattern (a) is used. However, if the time-domain interpolation encoding method of the present invention is used, the overall distortion performance of the DAC can be improved compared with the conventional technology.

Figure 10:
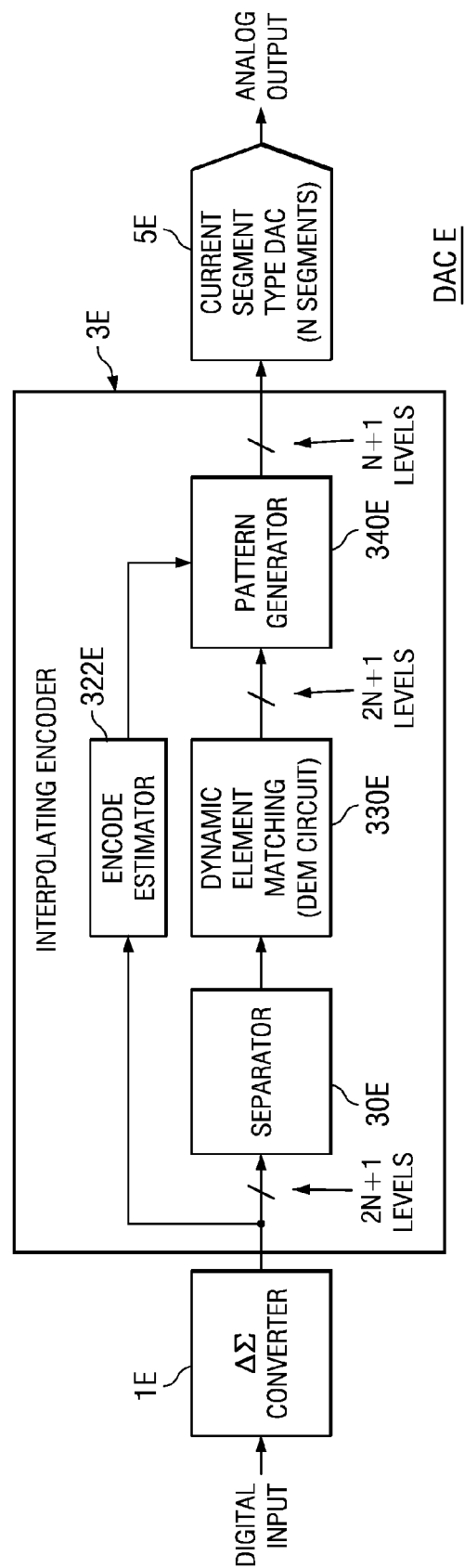
FIG. 10 is a diagram illustrating a digital-to-analog converter (DAC) in an embodiment that further embodies the DAC shown in FIG. 5.

In the following, DAC E in an embodiment that further embodies DAC C shown in FIG. 5 will be explained based on FIG. 10. DAC E adds dynamic element matching (DEM) to DAC D shown in FIG. 6. Also, in FIG. 10, symbol "E" is appended to the same reference number for the elements corresponding to FIG. 5 or 6. Said DAC E has almost the same configuration as that shown in FIG. 5. As shown in the figure, interpolating encoder 3E equivalent to weight controller 3C is equipped with separator 30E, DEM circuit 330E, encode estimator 322E, and pattern generator 340E. The difference from the configuration shown in FIG. 5 is that DAC E has ΔΣ modulator 1E and current segment type DAC 5E having N current segments in the same way as shown in FIG. 6. When DEM processing is added to DAC D shown in FIG. 6 by using the DAC E with the aforementioned configuration, the influence of the mismatch between the current segments can be reduced.

Figure 11:
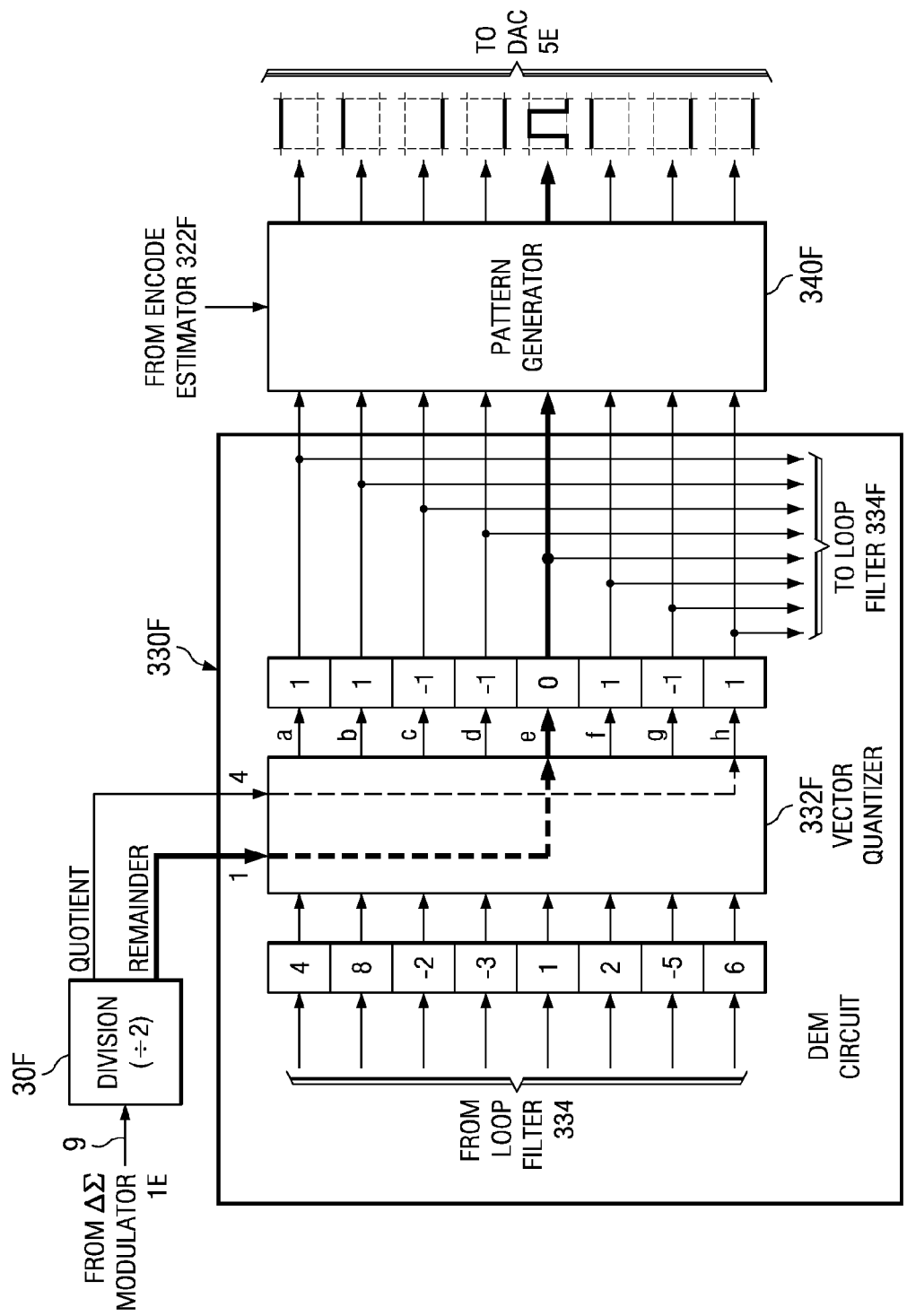
FIG. 11 is a block diagram illustrating the circuit configuration in an embodiment that further embodies several parts of the DAC shown in FIG. 10.
Figure 13:
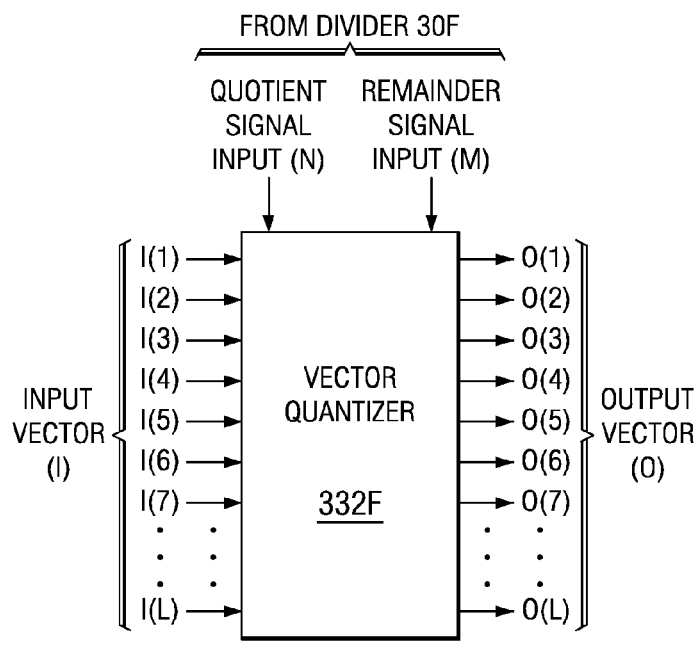
FIG. 13 is a block diagram illustrating the vector quantizer as part of the DEM circuit shown in FIG. 12.
Figure 16:
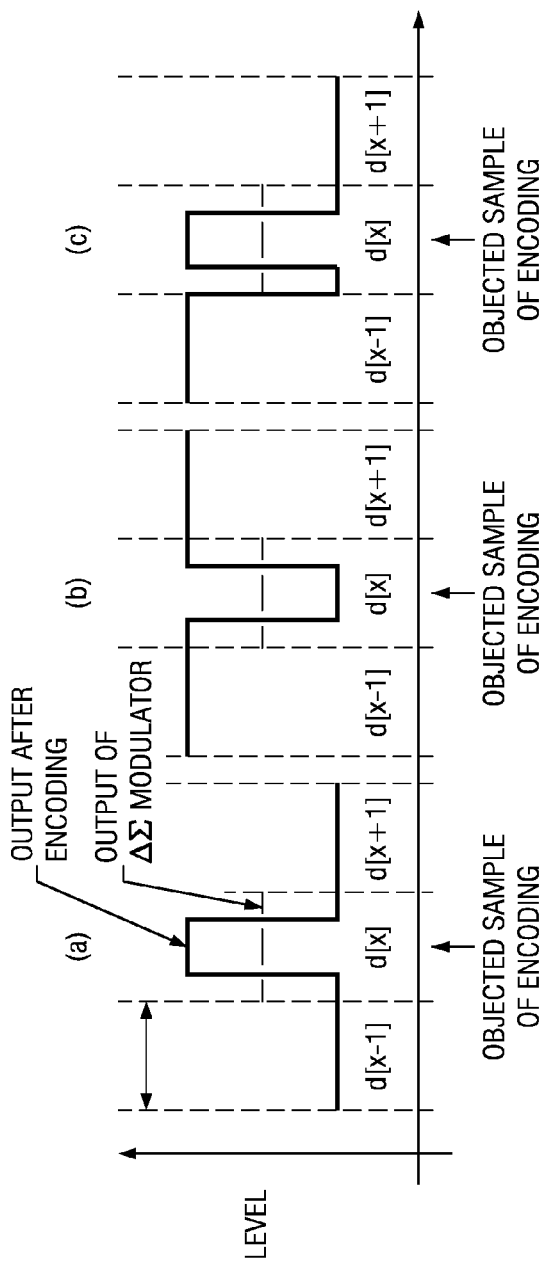
FIG. 16 is a diagram illustrating a waveform example for explaining the pattern selection process based on the selection algorithm of FIG. 15.
Figure 17:
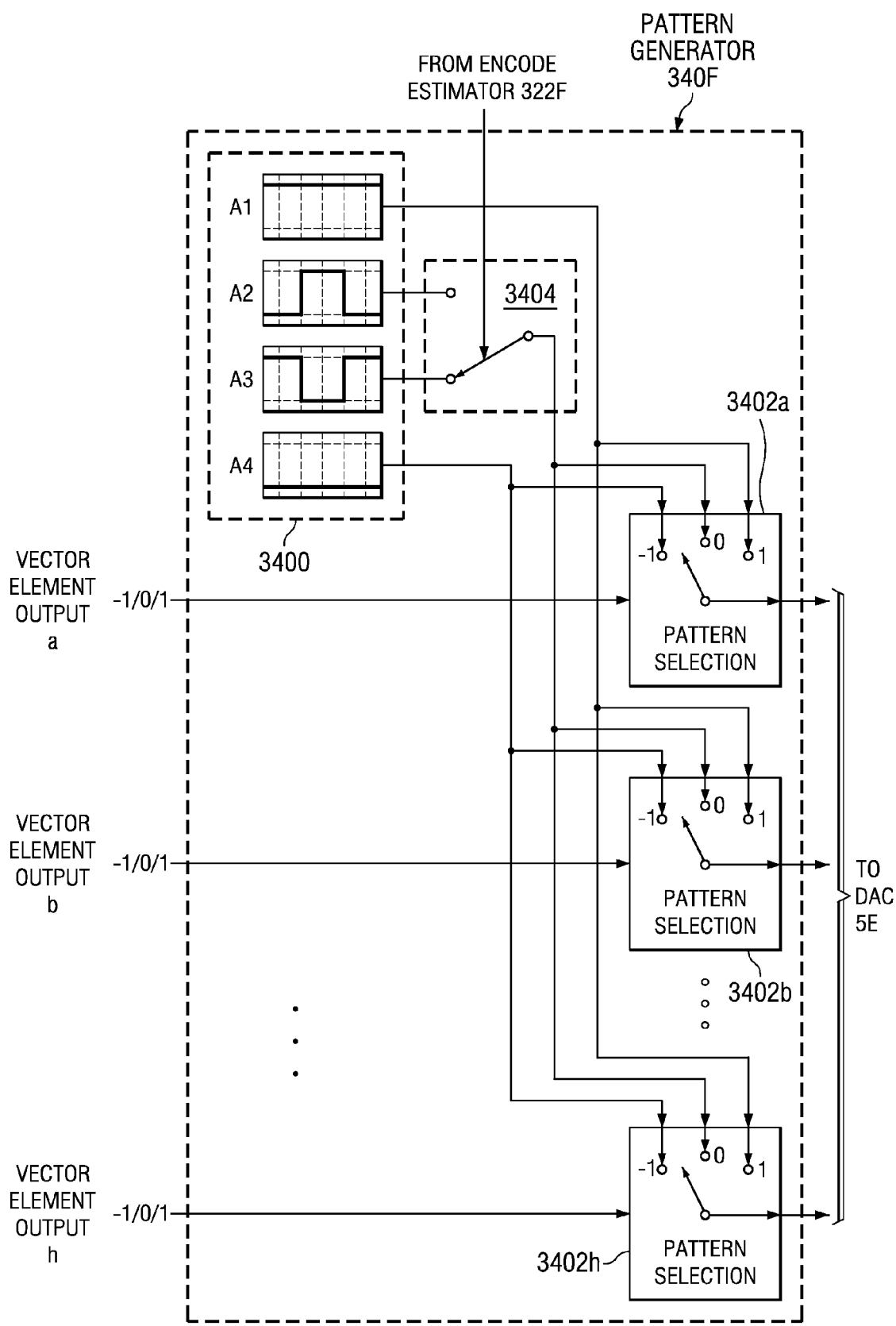
FIG. 17 shows details for a circuit of pattern generator 340F of FIG. 11.

In the following, the circuit configuration in an embodiment that further embodies each part of DAC E shown in FIG. 10 will be explained based on FIGS. 11-17. FIG. 11 shows the details of only part of DAC E, that is, circuit part equivalent to separator 30 shown in FIG. 10 (that is, divider 30F), part of the circuit equivalent to DEM circuit 330E, and circuit part equivalent to pattern generator 340E (that is, pattern generator F). FIG. 12 shows the entire DEM circuit 330F. FIG. 13 shows the circuit in part of DEM circuit 330F shown in FIG. 12 (that is, vector quantizer (VQ) 332F). FIG. 14 shows the circuit part equivalent to encode estimator 322E (that is, encode estimator 322F). FIG. 17 shows the details of the circuit of pattern generator 340F.

First, divider 30F shown in FIG. 11 receives the modulation output from modulator 1E, divides the received modulation output by 2, and generates the quotient and remainder at the outputs. Also, in the detailed circuit configuration examples shown in FIGS. 11-17, in order to reduce the weight level by half by constituting the odd-numbered weight level with interpolating weight level as shown in FIG. 7, it is divided by 2 by using divider 30F. Since said division is equivalent to separating the multi-bit output of the ΔΣ modulator into the least significant bit and a bit group constituted with the rest of the bits, the output of the modulator can be separated into the least significant bit and the bit group of the rest of the bits simply depending on the separation of the wiring. In the example shown in FIG. 11, if the output of the modulator is "9," the value of the quotient is "4," and the remainder is "1." The quotient and remainder generated this way are supplied to the vector quantizer 332F in DEM circuit 330F.

As shown in FIG. 12, besides vector quantizer (VQ) 332F, loop filter 334F arranged on the path from the input to the output of quantizer 332F is also used to constitute DEM circuit 330F. In other words, vector quantizer 332F generates an output vector by performing quantization. The output vector is fed back through loop filter 334F and becomes the input vector to the quantizer to perform the next quantization cycle. For the vector quantizer in this embodiment, each output of the output vector has 1.5 bits. Three values including the value of "0" besides two values of "1," "−1" can be obtained. In this case, "0" indicates the bit that performs time-domain interpolation encoding. Values "1" and "−1" are normal bits. "1" indicates use of a current segment, while "−1" indicates no use.

In the following, the operation of vector quantizer 332F will be explained in more detail with reference to FIG. 13. As shown in the figure, vector quantizer 332F has input vector I composed of L inputs I[1]-I[L] and output vector O composed of L outputs O[1]-O [L]. Also, vector quantizer 332F is constituted appropriately to receive two signals, that is, quotient signal N and remainder signal M from divider 30F in this embodiment. The conventional vector quantizer only has one signal input.

Figure 13A:
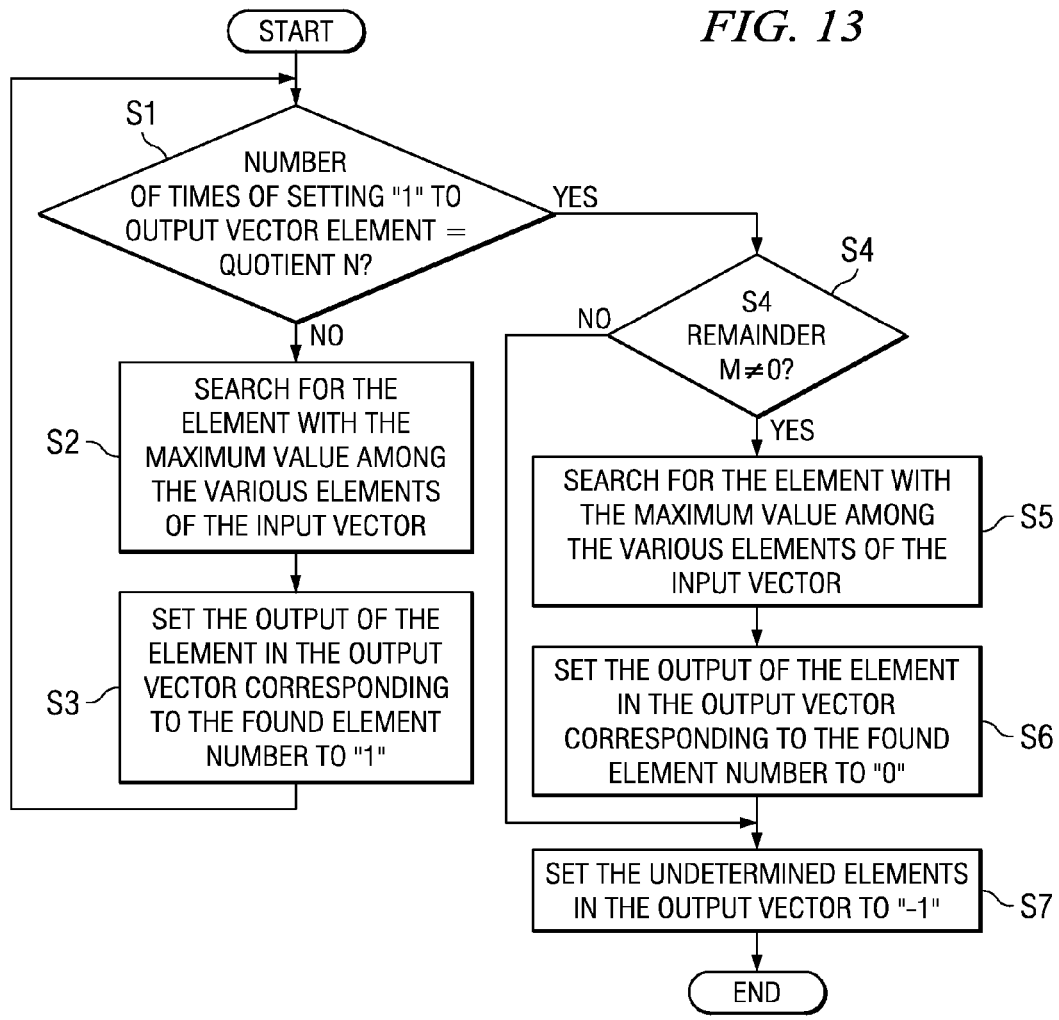
FIG. 13a is a flow diagram illustrating the vector quantization algorithm of the vector quantizer shown in FIG. 13.

FIG. 13a shows the vector quantization algorithm of vector quantizer 332F shown in FIG. 13. The output vector is determined according to the algorithm. First, in step S1, if the number of times "1" is set in the output vector element thus far is equal to quotient N, the process goes to step S4. Otherwise, the process goes to step S2. If it is not equal to quotient N, in step S2, the maximum value is searched among the various element values of the input vector. Said maximum value is searched among the element values for which the corresponding output element O[x] has not been determined, and the found element number is taken as X. That is, I[X]≧I[j]. In this case, 0≦j≦L, and j≠X, X is not used. Then, the process goes to step S3, wherein the output of the element of the output vector corresponding to the element number found in step S2 is set to "1." That is, O[X]=1. After that, the process goes back to step S1. On the other hand, if the answer is YES in step S1, that is, if the number of times "1" is set is equal to quotient N, the process goes to step S4, wherein it is determined whether remainder M is zero or not. If it is not zero, the process goes to step S5. If it is zero, the process goes to step S7. If the remainder is not zero, the maximum value is searched among the various element values of the input vector in step S5. Said maximum value is searched among the element values for which the corresponding output element O[x] has not been determined, and the found element number is taken as X. That is, I[X]≧I[j]. In this case, 0≦j≦L, and j≠X, X is not used. After that, the process goes to step S6, wherein the output of the element of the output vector corresponding to the element number found in step S5 is set to "1." That is, O[X]=1. On the other hand, if remainder N is found to be zero in step S4 or after step S6 is carried out, the process goes to step S7, wherein all of the elements of the output vector that have not been determined are set to "−1." In this way, the present algorithm is ended. The input vector is obtained by passing the output vector through the loop filter to multiply the output vector by −1. It is obtained by reversing the value obtained by integrating the output vector for each element (including high-order integration). Consequently, in the output vector, the input vector elements corresponding to the elements that are not set to "1" in the output vector become larger values so that they can be easily selected as the elements that output "1" in the next cycle. In this way, the number of times the current segments in DAC 5E are used can be averaged. DEM processing is realized in this way.

The operation of vector quantizer 332F explained above will be explained based on the example values shown in FIG. 11. In this case, the number of elements of the vector is L=8. In the example values shown in the figure, the various elements I[1]-I[8] of the input vector as the parallel output from loop filter 334F have values (shown in the boxes) of 4, 8, −2, −3, 1, 2, −5, 6. Also, the quotient from the divider is 4, and the remainder is 1. The vector quantizer sequentially selects the input vector elements in the number corresponding to the quotient "4" starting with the largest value. The output vector elements O[2], O[8], O[1], O[6] (corresponding to outputs b, h, f, a) corresponding to the sequentially selected elements I[2], I[8], I[1], I[6] are sequentially set to "1" (the values of the output vector elements are also shown in boxes). This process is carried out by repeating steps S1-S3 four times. Then, after the number setting to "1" is set becomes equal to quotient 4, since the remainder is 1, the input vector element I[5] having the next largest value is selected, and the output vector element O[5] (corresponding to output e) corresponding to the selected input vector element is set to "0. " This is performed by carrying out steps S4-S6. Then, the output vector elements O[3], O[4], O[7] corresponding to the rest of input vector elements I[3], I[4], I[7] are set to "−1." This is realized by carrying out step S7. In this way, the values of the output vector are determined.

In the following, the circuit configuration of encode estimator 322F will be described in detail. As shown in the figure, encode estimator 322F is equipped with two delay units 3220 and 3222 that are connected in series and a pattern selection logic unit 3224. Pattern selection logic unit 3224 is equipped with input (d[x+1]) that directly receives the output of ΔΣ modulator 1E, input (d[x]) that receives the output of the modulator via delay unit 3220, and input (d[x−1]) that receives the output of delay unit 3220 via delay unit 3222. In this way, pattern selection logic unit 3224 receives the current sample d[x] in the modulator output and the two adjacent samples, that is, sample d[x−1] and sample d[x+1]. An estimation signal is generated at the output based on the values of the adjacent samples. The estimation signal is supplied to pattern generator 340F, and the use pattern to be selected is specified in pattern generator 340F.

FIG. 15 is an encode/pattern selecting table illustrating the selection algorithm in pattern selection logic unit 3224. FIG. 16 is a diagram illustrating a waveform example for explaining the pattern selection process based on said selection algorithm. In case 1 in the pattern selection table shown in FIG. 15, that is, if both of the adjacent samples are smaller than the current sample by 1, as shown in FIG. 16 at (a), the pattern that "projects upward" will be selected. In FIG. 16 at (a), for the sample as the interpolation encoding object, the dotted line shows the output of the ΔΣ modulator before interpolation encoding, while the solid line shows the output after interpolation encoding as a result of selecting the pattern that "projects upward." In case 2 in the pattern selection table, both of the adjacent samples are larger than the current sample by 1. In that case, as shown in FIG. 16 at (b), a pattern that "projects downward" will be selected. In FIG. 16 at (b), for the sample as the interpolation encoding object, like case (a), the dotted line shows the output of the ΔΣ modulator before interpolation encoding, while the solid line shows the output after interpolation encoding as a result of selecting the pattern that "projects downward." In case 3 in the pattern selection table, that is, when the situation does not fit either case 1 or 2 (either the previous sample or the next sample is larger than the current sample, while the other sample is smaller than the current sample) and the current sample is larger than 0, that is, positive, as shown in FIG. 16 at (c), the pattern that "projects upward" will be selected. In FIG. 16 at (c), like case (a), the dotted line shows the output of the ΔΣ modulator before interpolation encoding, while the solid line shows the output after interpolation encoding as a result of selecting the pattern that "projects upward." On the other hand, case 4 in the pattern selection table is different from case 3. Since the current sample is negative, the pattern that "projects downward" will be selected. The estimation signal generated by pattern selection logic unit 3224 becomes low, for example, when the pattern that "projects downward" is shown and becomes high when the pattern that "projects upward" is shown.

In the following, the circuit configuration of pattern generator 340F will be explained in detail based on FIG. 17. As shown in the figure, pattern generator 340F is equipped with pattern memory 3400, 8 pattern selectors 3402a-3402h (8 is the same as the number of the output vector elements of vector quantizer 332F in the embodiment shown in FIG. 11), and one switch 3404. More specifically, pattern memory 3400 has two memory regions A2 and A3 that store the two waveform data of the pattern "that projects upward" and the pattern that "projects downward" used for time-domain interpolation encoding. This circuit also has two memory regions A1 and A4 that store the waveform data of two patterns with all the elements at high level (corresponding to "1") and at low level (corresponding to "−1") (they are not used in interpolation encoding). Switch 3404 has two input terminals, one control input terminal, and one output terminal. The two inputs are connected to the outputs of memory regions A2 and A3. The control input terminal is connected appropriately to receive the estimation signal sent from estimator 322F. When the estimation signal is high, the output of memory region A2 will be selected since the pattern that "projects upward" is shown. When the estimation signal is low, the output of memory region A3 will be selected since the pattern that "projects downward" is shown. On the other hand, pattern selectors 3402-a-h have exactly the same configuration with three input terminals ("−1," "0," "+1"), one control input terminal, and one output terminal. Of the three input terminals of the selector, input terminal "−1" is directly connected to the output of memory region A4. Input terminal "1" is directly connected to the output of memory region A1. Input terminal "0" is connected to the output terminal of switch 3404. Also, the control input terminal of the selector is connected to the corresponding element outputs a-h of the output vector of vector quantizer 332F. When the control input is "−1," the input of input terminal "−1" is selected. When the control input is "0," the input of input terminal "0" is selected. When the control input is "1," the input of input terminal "1" is selected and supplied to the output terminal. The output terminal of the selector is connected to the input of DAC 5E.

In the following, the operation of pattern generator 340F with the aforementioned configuration will be explained using the example values shown in FIG. 11 with reference to said FIG. 16. First, in the example shown in the figure, since the values of the vector outputs a, b, f, h of vector quantizer 332F are 1, pattern selectors 3402a, b, f, h select and output the input of input terminal "1," that is, the all-high pattern from memory region A1. On the other hand, in the case of vector element outputs c, d, g, since the values of these element outputs are −1, pattern selectors 3402c, d, g select and output the input of input terminal "−1," that is, the all-low pattern from memory region A4. In the case of vector element output e, since the value of the element output is 0, pattern selector 3402 selects and outputs the input of input terminal "0," that is, the pattern for interpolation encoding from memory region A2 or A3 depending on the estimation signal sent from estimator 322F. In this way, the interpolation encoding shown in FIG. 16 at (a)-(c) is performed. In pattern generator 340F explained above, not only the pattern for interpolation encoding but also the normal patterns can be stored in pattern memory 3400. This method is adopted in order to facilitate timing control in the pattern generating operation. Consequently, it is also possible to store only the pattern for interpolation encoding in the pattern memory and use the output of the vector quantizer 332F directly as the normal pattern.

In the following, the advantages of using time-domain encoding will be explained in detail based on a system example designed in the C programming language with reference to FIGS. 18a-21. This system example has the following configuration: the sampling frequency Fs is 48 KHz, and the ΔΣ modulator has three orders and 33 levels at 64 Fs. The time-domain interpolation encoding method only uses patterns (a) and (b) shown in FIG. 8, and 16 analog segments (17 levels) are used. In addition, no DEM processing is used in this system example. The simulation focuses on the effectiveness of the time-domain interpolation encoding method.

Figure 18A:
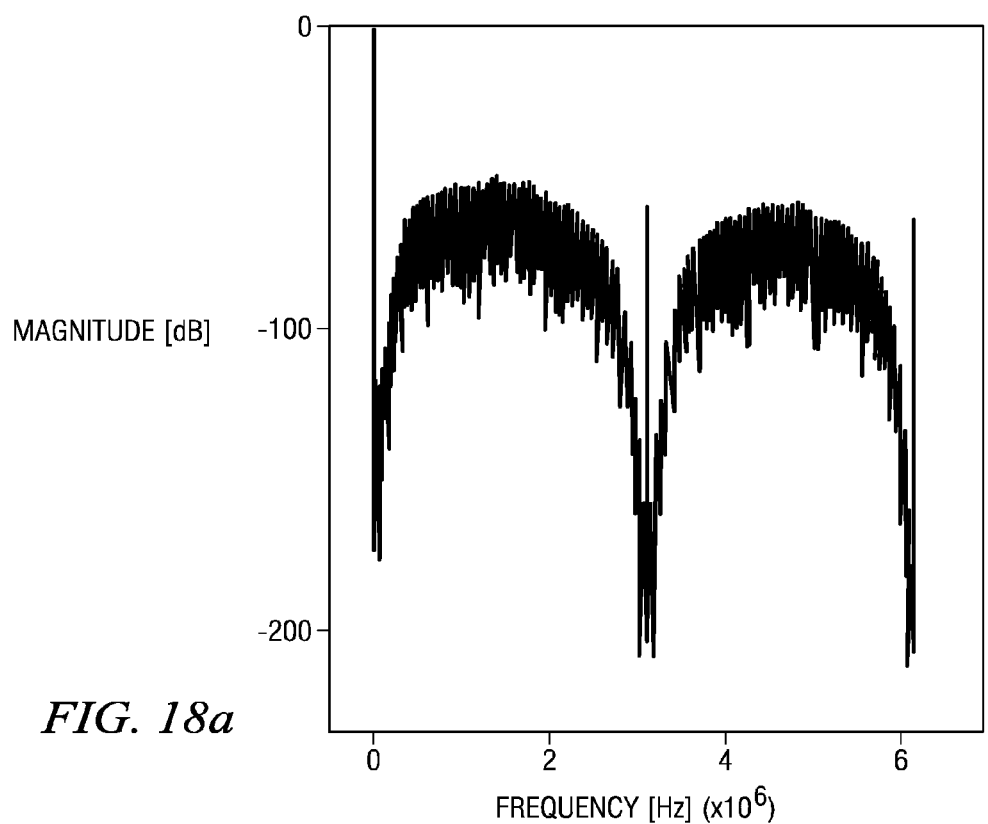
FIGS. 18a and 18b are frequency spectral diagrams illustrating the results of wide-band DFT (discrete Fourier transform) without and with time-domain interpolation encoding.
Figure 18B:
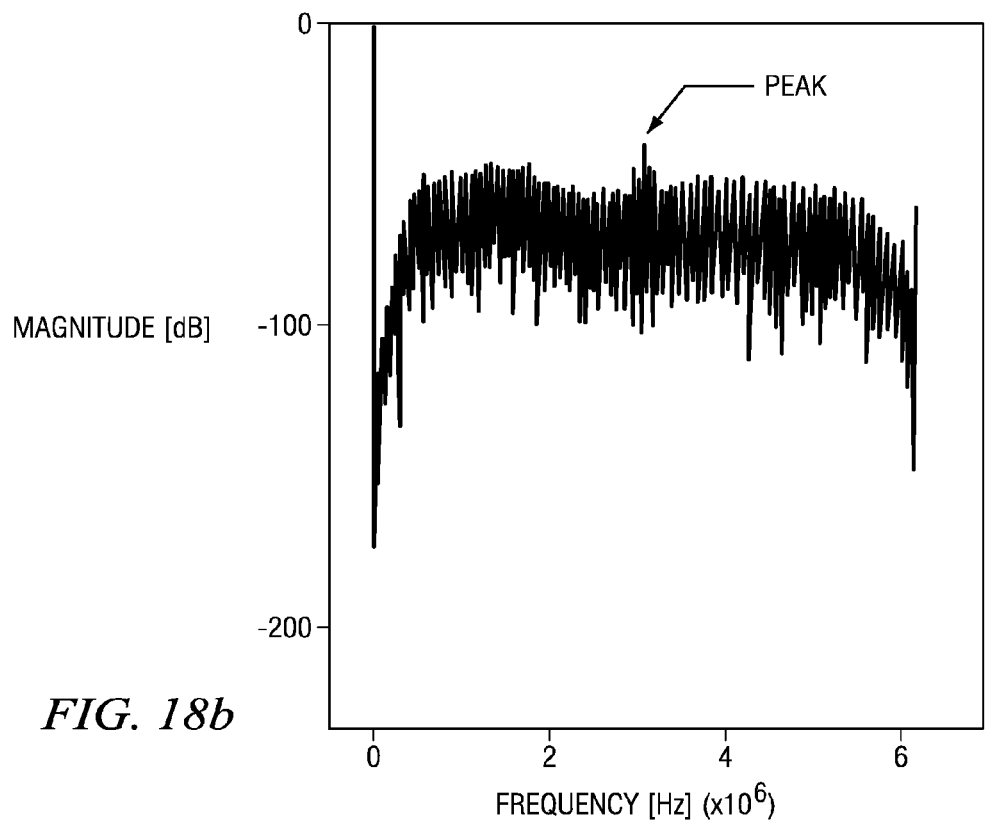
Figure 19A:
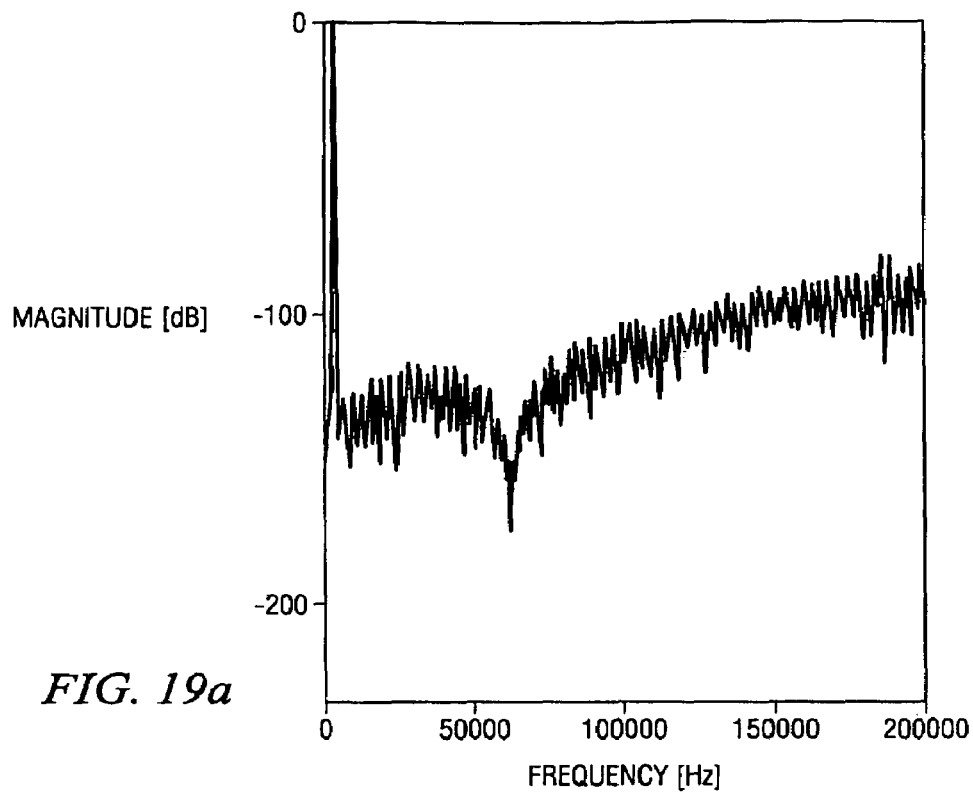
FIGS 19a and 19b show frequency spectra of the audio band with and without time-domain interpolation encoding.
Figure 19B:
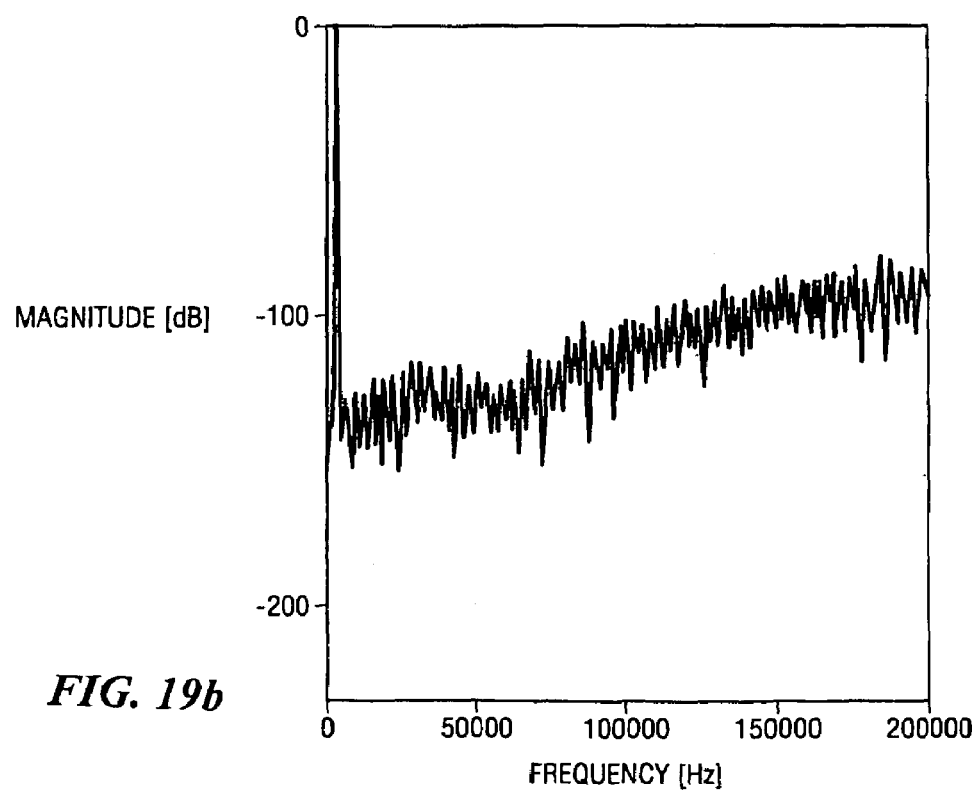

FIGS. 18a and 18b are frequency spectral diagrams illustrating the results of wide-band DFT (discrete Fourier transform) when time-domain interpolation encoding is not performed (FIG. 18a) and when time-domain interpolation encoding is performed (FIG. 18b). In other words, FIG. 18a shows the frequency spectrum of the output of the ΔΣ modulator. FIG. 18b shows the frequency spectrum of the output of the interpolating encoder. Also, FIGS. 19a and b show the frequency spectra of the audio band when time-domain interpolation encoding is performed (FIG. 19a) and when time-domain interpolation encoding is not performed (FIG. 19b) in the same way as shown in FIGS. 18a and b. First, the comparison between the spectra shown in FIGS. 18a and b shows that a small peak is present at 64 Fs (=3.136 MHz), that is, the operating frequency of the ΔΣ modulator in the spectrum shown in FIG. 18b. This peak is caused by time-domain interpolation encoding and has the component of 64 Fs correctly. In the low-frequency band, however, as shown in FIGS. 19a and b, almost the same spectra are observed. Therefore, it is clear that the time-domain interpolation encoding method is effective in increasing the number of weight levels without increasing the number of analog segments.

Figure 20:
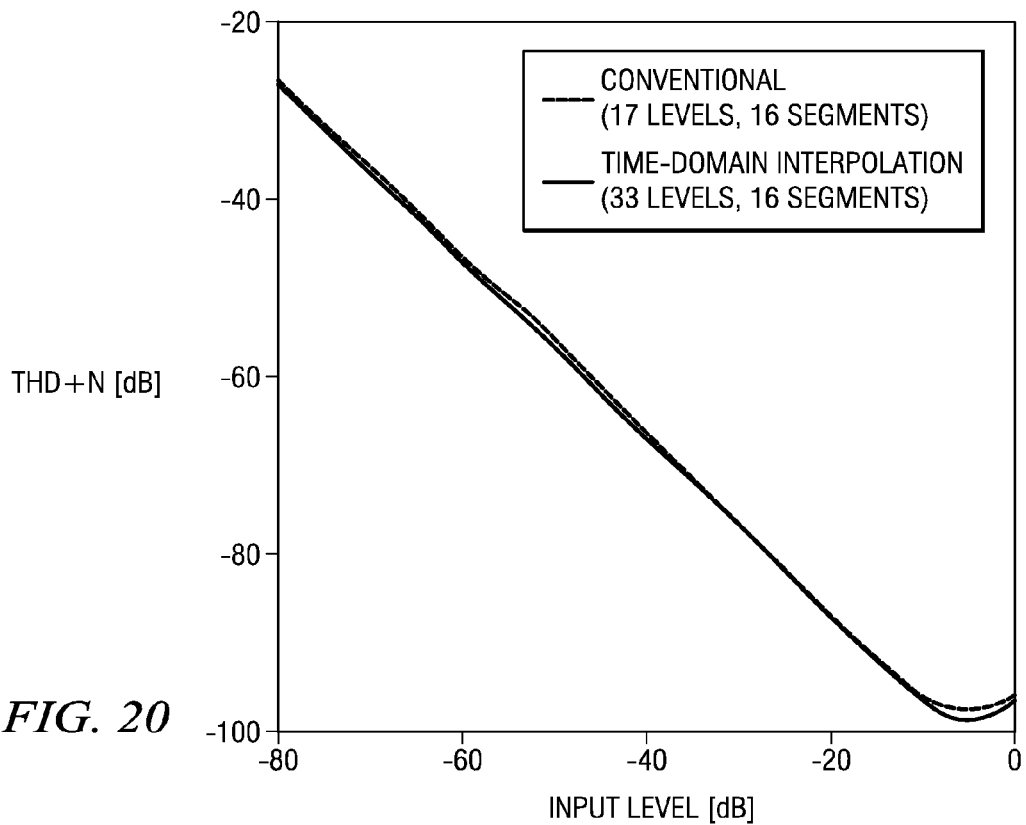
FIG. 20 shows the relationship between the input level and THD+N (total harmonic distortion+noise) for a described system example.

FIG. 20 shows the relationship between the input level and THD+N (total harmonic distortion+noise) in the aforementioned system example. As described above in the explanation of FIG. 9, when time-domain interpolation encoding is used, the high-speed switching of the analog segments will cause undesired switching errors. As a result, the THD performance deteriorates. Consequently, a simulation including switching errors of the analog segments is also performed in the C programming language. The result is shown in FIG. 20. The dotted line in FIG. 20 shows the characteristic in the case of a DAC architecture having a configuration in which 16 analog segments are connected to a 17-level ΔΣ modulator. On the other hand, the solid line shows the characteristic in the case of the DAC architecture using time-domain interpolation encoding. In this case, 16 analog segments are connected to a 33-level ΔΣ modulator. Noise equivalent to that generated by actual analog parts are added to the results of both simulations. The comparison between these characteristics shows that the THD performance does not deteriorate even if time-domain interpolation encoding is applied.

Figure 21:
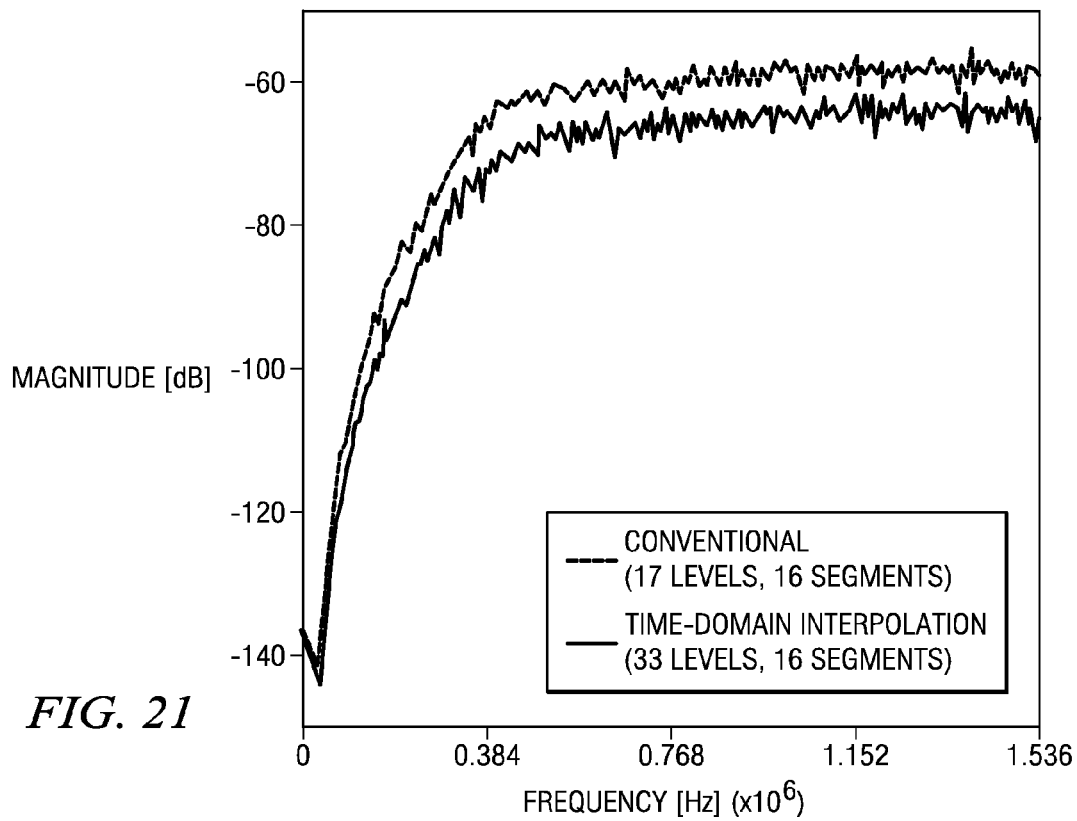
FIG. 21 shows the out-of-band noise in the case of the conventional configuration using the same number of analog segments as that shown in FIG. 20 and in the case when time-domain interpolation is performed.

FIG. 21 shows the out-of-band noise in the case of the conventional configuration using the same number of analog segments as that shown in FIG. 20 and in the case when time-domain interpolation is performed. The dotted line indicates the characteristic in the case of the conventional DAC architecture (constituted with 17-level ΔΣ modulator and 16 analog segments connected to the modulator). The solid line indicates the characteristic in the case of the DAC architecture using time-domain interpolation encoding (16 analog segments are connected to a 33-level ΔΣ modulator). The comparison shows that when time-domain interpolation is used, a reduction in the out-of-band noise of 6 dB can be expected theoretically.

Figure 22C:
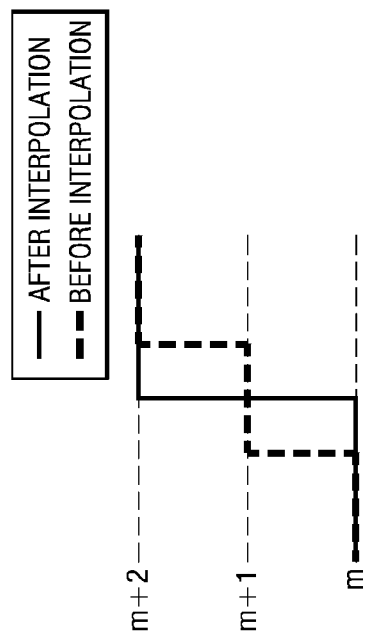
FIGS. 22a, 22b and 22c show waveforms before and after interpolation for various weight use patterns.
Figure 22B:
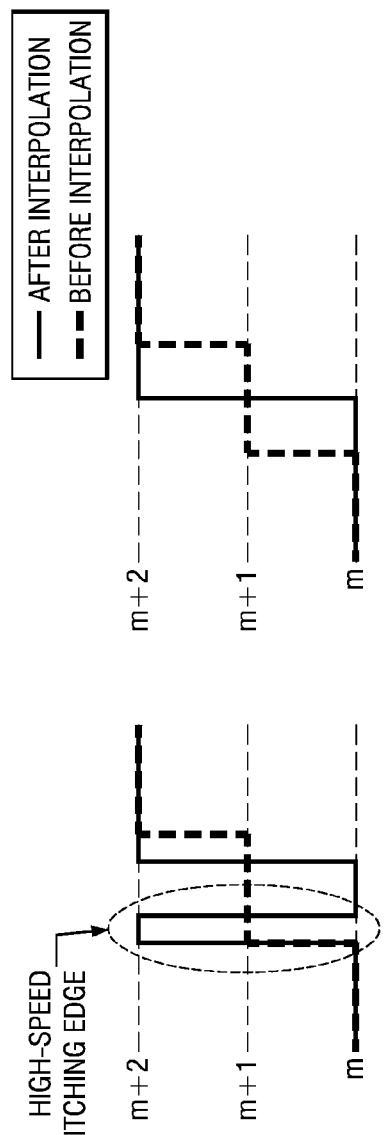
Figure 22A:
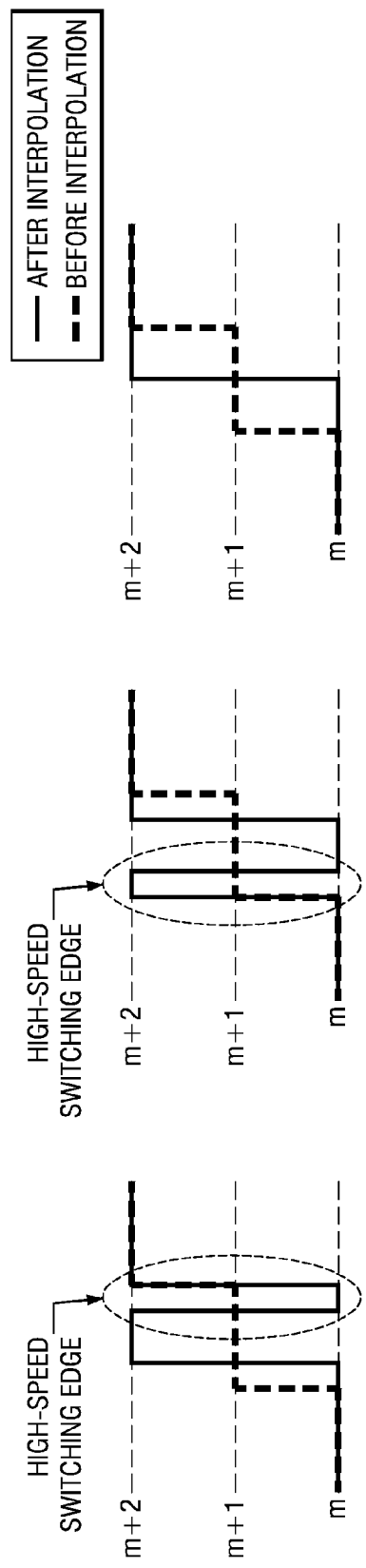

In the following, the cases of using patterns other than patterns (a) and (b) in FIGS. 8a and b as the pattern for time-domain interpolation will be explained based on FIG. 22. The aforementioned simulation is performed under the condition that only the patterns (a) and (b) shown in FIGS. 8a and b are used as the interpolation patterns as described above. FIG. 22 shows the waveforms before and after interpolation in the case when using the first three patterns of patterns (a), (b), (c), (d) shown in FIGS. 8a, b, c and d. FIG. 22 also shows case 3 in FIG. 15, that is, the sample before and after the current sample have different values. As shown in the figure, in the interpolation encoding of patterns (a) and (b), a high-speed switching edge occurs due to the problem of the connectivity between the current sample as the interpolation object and the preceding and succeeding samples. However, when pattern (c) is used, said additional high-speed switching edge does not occur. Therefore, if pattern (c) or (d) is added, more high-speed switching edge can be reduced. However, as described above, pattern (c) or (d) causes serious aliasing due to the out-of-band noise, and the in-band dynamic range at low frequencies deteriorates significantly. Since it is believed that said aliasing is caused by the phase shifted component of the pattern after interpolation encoding, this problem can be overcome by performing a certain type of error (aliasing) correction. Patterns (c) and (d) can be used only under limited circumstances in order to reduce the high-speed switching edge.

In the aforementioned explanation of several embodiments (FIGS. 6, 10, etc.), the even-numbered weight level is used to generate the interpolated weight level, which will replace the odd-numbered weight level. In these embodiments, however, even if the interpolating encoder operates in the same way at a clock frequency four times of the ΔΣ modulator, three interpolated weight levels between two weight levels can be generated instead of one.

Figure 23:
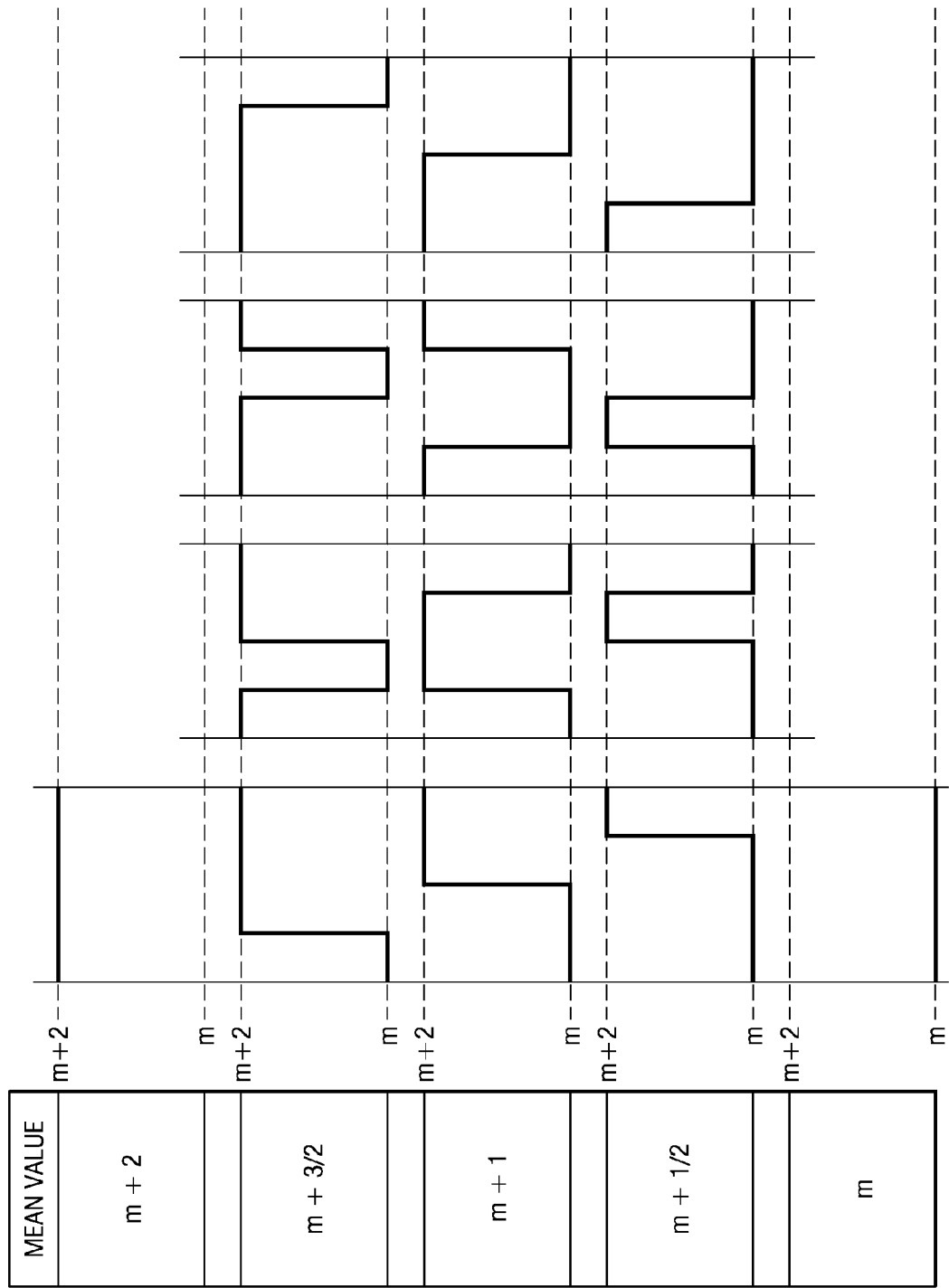
FIG. 23 illustrates a reinforced time-domain interpolation encoding method using the use pattern of analog segments when three interpolated weight levels are generated.

FIG. 23 shows a reinforced time-domain interpolation encoding method using the use pattern of analog segments when three interpolated weight levels are generated. For the use pattern shown in the figure, the duty ratio is 0 or 1 for a period of ¼ KFs. If a period of 1/KFs is used as the reference period, the duty ratio has a value varying as ¼, 2/4, ¾. More specifically, interpolated weight levels (m+½), (m+1), (m+⅔) are generated between two weight levels m and m+2. Of these interpolated weight levels, level (m+1) uses four different patterns with a duty ratio of ½ in the same way as described above. Level (m+½) uses four different patterns with a duty ratio of ¼. Also, level (m+3/2) uses four different patterns with a duty ratio of ¾. Since four times as many weight levels can be applied to the ΔΣ modulator compared with the non-reinforced case, a 64-level ΔΣ modulator can be used in conjunction with a current segment type DAC having only 16 segments.

Figure 24:
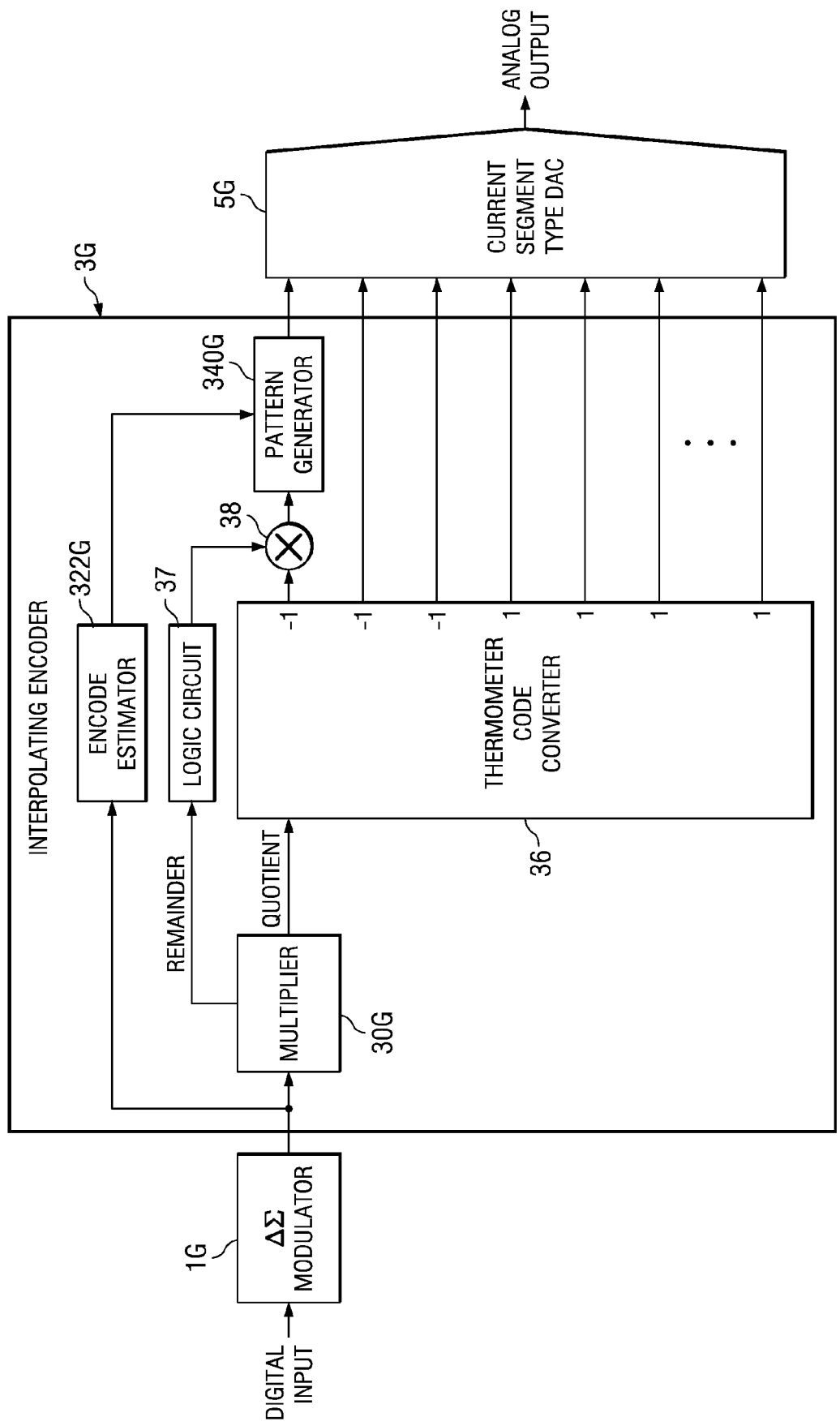
FIG. 24 illustrates a digital to analog converter DAC G in and embodiment that further embodies the DAC D shown in FIG. 6.

In the following, DAC G in an embodiment that further embodies the DAC D shown in FIG. 6 will be explained based on FIG. 24. In this figure, symbol "G" is appended to the same reference number for the elements corresponding to FIG. 6 or 5. Said DAC G uses ΔΣ modulation and uses a current segment type DAC as the weight generator. However, it has a simpler configuration without the DEM circuit shown in FIGS. 5, 10, 11. More specifically, DAC G is equipped with ΔΣ modulator 1G, interpolating encoder 3G, and current segment type DAC 5G. In order to simply the explanation, only the part different from DAC E shown in FIG. 10 and the circuit configuration shown in FIGS. 11-17 will be explained. Interpolating encoder 3G is equipped with divider 30G, thermometer code converter 36, logic circuit 37, multiplier 38, encode estimator 322G, pattern generator 340G. Divider 30G generates the quotient signal and remainder signal in the same way as divider 30F. Then, the quotient signal is supplied to thermometer code converter 36. Said converter 36 converts the received quotient into a thermometer code and outputs the result. Said thermometer code increases by "1" sequentially from the lowest output among plural outputs as show in the block in the figure as the value of the quotient increases. The remainder signal is supplied to logic circuit 37. Said circuit inverts the remainder signal and outputs the result. The inverted remainder signal is multiplied by multiplier 38 with respect to the output indicating the largest number in the thermometer code (output arranged at the top in the figure). When the remainder signal is "1," the highest output signal becomes zero. This has the same effect as the output "0" of vector quantizer 332F shown in FIG. 12 to indicate that time-domain interpolation encoding will be performed. The output of multiplier 38 is supplied to pattern generator 340G. Said pattern generator generates the pattern in the same way as described above. In this configuration, the segment required for pattern generation is fixed to the top one. It is possible to use only one segment in the pattern generator. In other words, pattern generator 340G can be constituted by using pattern memory 3400 and switch 3404 and only one pattern selector 3402a in pattern generator 340F shown in FIG. 7. By using DAC G with said simple configuration, the number of analog segments can be reduced.

The various embodiments of the present invention were explained above in detail. Only two time rates are used in these embodiments. However, it is clear to those who are familiar with this technology that three or more time rates can also be used. In addition, various modifications and changes can be made to the aforementioned embodiments.

What is claimed is:

1. A weight level generating method comprising:
providing plural weights; and using at least one of said plural weights at least two different time rates, wherein said at least one weight can be a specific or any weight selected from said plural weights and wherein said at least two different time rates includes a first time rate and a second time rate time rate higher than the first time rate.

2. The weight level generating method described in claim 1 wherein when said weight is used at said second time rate, a different duty ratio per reference time than that used when the weight is used at said first time rate is used.

3. The weight level generating method described in claim 2 wherein at least one weight level that can use and generate said weight at said second time rate constitutes an interpolating weight level that interpolates the weight level that uses and generates said weight at said first time rate.

4. The weight level generating method described in claim 3 wherein
said interpolating weight level is determined by the average of the weight levels during said reference time;

said weight level average is generated by one of the plural patterns of the weight level; and plural patterns of the weight level are determined by the weight use pattern related to plural periods determined by said second time rate during said reference time.

5. The weight level generating method described in claim 1 wherein said plural weights have the same or different magnitudes, and said plural weights are in the form of a current or voltage.

6. The weight level generating method described in claim 1 wherein said method is used in D/A conversion that converts digital signals into analog signals.

7. A weight level generator comprising:

plural weight generators; and a controller for using at least one of said plural weight generators at least two different time rates, wherein said controller is a weight controller that generates a weight control signal for using each of said plural weight generators at one of said at least two different time rates, said at least two different time rates include a first time rate and a second time rate higher than the first time rate; at least one of said plural weight generators is used at said first time rate or second time rate, while the other weight generators are used at said first time rate;

said other weight generators constitute a first weight generator group, while said at least one weight generator constitutes a second weight generator group; and combination of the weight generators of said first weight generator group and the combination of the weight generators that constitute said second weight generator group are variable or fixed.

8. The weight level generator described in claim 7 wherein said weight is used at said second time rate, a different duty ratio per reference time than that used when the weight is used at said first time rate is used.

9. The weight level generator described in claim 8 wherein at least one weight level that can use and generate said weight at said second time rate constitutes an interpolating weight level that interpolates the weight level that generates and uses said weight at said first time rate.

10. The weight level generator described in claim 9 wherein:

said interpolating weight level is determined by the average of the weight levels during said reference time;

said weight level average is generated by one of the plural patterns of the weight level; and the plural patterns of the weight level are determined by the weight use pattern related to plural periods determined by said second time rate during said reference time.

11. The weight level generator described in claim 7 wherein said weight controller includes:

a separator that receives a digital signal and separates said digital signal into a first digital signal part suitable for said first time rate and a second digital signal part suitable for said first or second time rate; and a weight control signal generator that generates a weight control signal supplied to said plural weight generators.

12. The weight level generator described in claim 11 wherein said weight control signal generator includes:

an encoder that receives said first digital signal, said second digital signal part, and said estimation signal and generates a weight control signal supplied to each of said plural weight generators in response to them; and an encode estimator that generates an estimation signal that specifies one of the plurality of use patterns of the related weight generators from the current sample and the adjacent sample in said digital signal.

13. The weight level generator described in claim 12 wherein said encoder includes:

a time rate controller, which generates a first encode signal including a signal indicating the first time rate in response to said first digital signal part with respect to each weight generator in said first weight generator group and generates a second encode signal including a signal indicating the first or second time rate in response to said second digital signal part with respect to each weight generator in said second weight generator group; and a pattern generator, which is connected to said time rate controller and encode estimator and generates a weight control signal having said first time rate in response to said first encode signal with respect to each weight generator in said first weight generator group and generates a weight control signal having said first or second time rate in response to said second encode signal with respect to each weight generator in said second weight generator group;

wherein said pattern generator generates said weight control signal having a designated use pattern in response to said second encode signal and estimation signal when the weight control signal of said second time rate is generated with respect to each weight generator in said second weight generator group.

14. The weight level generator described in claim 11 wherein said separator includes a divider that divides said digital signal with a divisor related to interpolation and uses the result of said division and remainder as the first digital signal part and second digital signal part, respectively.

15. The weight level generator described in claim 13 wherein said time rate controller is included in a dynamic element matching (DEM) circuit, and said DEM circuit carries out a DEM processing with respect to the encode signal group generated by said time rate controller.

16. A digital-to-analog converter that converts digital signal to analog signal comprising:

plural weight generators;

a controller for using at least one of said plural weight generators at least two different times;

wherein the plural weight generators in a weight level generator are controlled by said digital signal, said controller is a weight controller that generates a weight control signal for using each of said plural weight generators at one of said at least two different time rates, said at least two different time rates include a first time rate and a second time rate higher than the first time rate;

at least one of said plural weight generators is used at said first time rate or second time rate, while the other weight generators are used at said first time rate; and said other weight generators constitute a first weight generator group, while said at least one weight generator constitutes a second weight generator group;

the combination of the weight generators of said first weight generator group and the combination of the weight generators that constitute said second weight generator group are variable or fixed.

17. The analog-to-digital converter described in claim 16 wherein said weight is used at a second time rate, a different duty ratio per reference time than that used when the weight is used at a first time rate is used.

18. The analog-to-digital converter described in claim 16 wherein at least one weight level that can use and generate said weight at a second time rate constitutes an interpolating weight level that interpolates the weight level that generates and uses said weight at a first time rate.

19. The analog-to-digital converter described in claim 16 wherein:

an interpolating weight level is determined by the average of the weight levels during said reference time;

said weight level average is generated by one of the plural patterns of the weight level; and a plural patterns of a weight level are determined by the weight use pattern related to plural periods determined by said second time rate during a reference time.

20. The analog-to-digital converter described in claim 16 wherein said weight controller includes:

a separator that receives a digital signal and separates said digital signal into a first digital signal part suitable for said first time rate and a second digital signal part suitable for said first or second time rate; and a weight control signal generator that generates a weight control signal supplied to said plural weight generators.

21. The analog-to-digital converter described in claim 16 wherein said weight control signal generator includes:

an encoder that receives a first digital signal, said second digital signal part, and a estimation signal and generates a weight control signal supplied to each of said plural weight generators in response to them; and an encode estimator that generates an estimation signal that specifies one of the plurality of use patterns of the related weight generators from a current sample and the adjacent sample in said digital signal.

22. The analog-to-digital converter described in claim 16 wherein an encoder includes:

a time rate controller, which generates a first encode signal including a signal indicating a first time rate in response to a first digital signal part with respect to each weight generator in a first weight generator group and generates a second encode signal including a signal indicating the first or second time rate in response to said second digital signal part with respect to each weight generator in said second weight generator group;

and a pattern generator, which is connected to a time rate controller and encode estimator and generates a weight control signal having said first time rate in response to said first encode signal with respect to each weight generator in said first weight generator group and generates a weight control signal having said first or a second time rate in response to said second encode signal with respect to each weight generator in a second weight generator group;

wherein said pattern generator generates said weight control signal having a designated use pattern in response to said second encode signal and estimation signal when the weight control signal of said second time rate is generated with respect to each weight generator in said second weight generator group.

23. The analog-to-digital converter described in claim 16 wherein said separator includes a divider that divides said digital signal with a divisor related to interpolation and uses the result of said division and remainder as the first digital signal part and second digital signal part, respectively.

24. The analog-to-digital converter described in claim 16 wherein a time rate controller is included in a dynamic element matching (DEM) circuit, and said DEM circuit carries out a DEM processing with respect to the encode signal group generated by said time rate controller.

* * * * *